(12) United States Patent
Nakanishi et al.

(10) Patent No.: US 9,361,952 B2
(45) Date of Patent: Jun. 7, 2016

(54) STORAGE CONTROLLING APPARATUS, MEMORY SYSTEM, INFORMATION PROCESSING SYSTEM AND STORAGE CONTROLLING METHOD

(71) Applicant: Sony Corporation, Tokyo (JP)

(72) Inventors: Kenichi Nakanishi, Tokyo (JP); Keiichi Tsutsui, Kanagawa (JP); Yasushi Fujinami, Tokyo (JP); Naohiro Adachi, Tokyo (JP); Hideaki Okubo, Saitama (JP); Ken Ishii, Tokyo (JP); Tatsuo Shinbashi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 234 days.

(21) Appl. No.: 13/780,655

(22) Filed: Feb. 28, 2013

(65) Prior Publication Data

US 2013/0272078 A1    Oct. 17, 2013

(30) Foreign Application Priority Data

Apr. 16, 2012  (JP) ................................. 2012-092591
Oct. 29, 2012  (JP) ................................. 2012-237590

(51) Int. Cl.
*G11C 7/00*  (2006.01)
*G11C 7/10*  (2006.01)

(52) U.S. Cl.
CPC ................ *G11C 7/00* (2013.01); *G11C 7/1006* (2013.01)

(58) Field of Classification Search
None
See application file for complete search history.

(56) References Cited

U.S. PATENT DOCUMENTS 6,292,868 B1 *   9/2001  Norman ......................... 711/103
7,783,846 B2 *   8/2010  Chainer ......................... 711/159
8,351,290 B1 *   1/2013  Huang et al. .................. 365/218

FOREIGN PATENT DOCUMENTS

JP      2006-106577      4/2006

* cited by examiner

*Primary Examiner* — Denise Tran
(74) *Attorney, Agent, or Firm* — Chip Law Group

(57) ABSTRACT

Disclosed herein is a storage controlling apparatus including: a decision portion configured to decide whether or not a bit number of a specific value from between binary values is greater than a reference value in at least part of input data to a memory cell, which executes rewriting to one of the binary values and rewriting to the other one of the binary values in order in a writing process, to generate decision data indicative of a result of the decision; and a write side outputting portion configured to output, when it is decided that the bit number is greater than the reference value, the input data at least part of which is inverted as write data to the memory cell together with the decision data.

15 Claims, 40 Drawing Sheets

F I G . 1
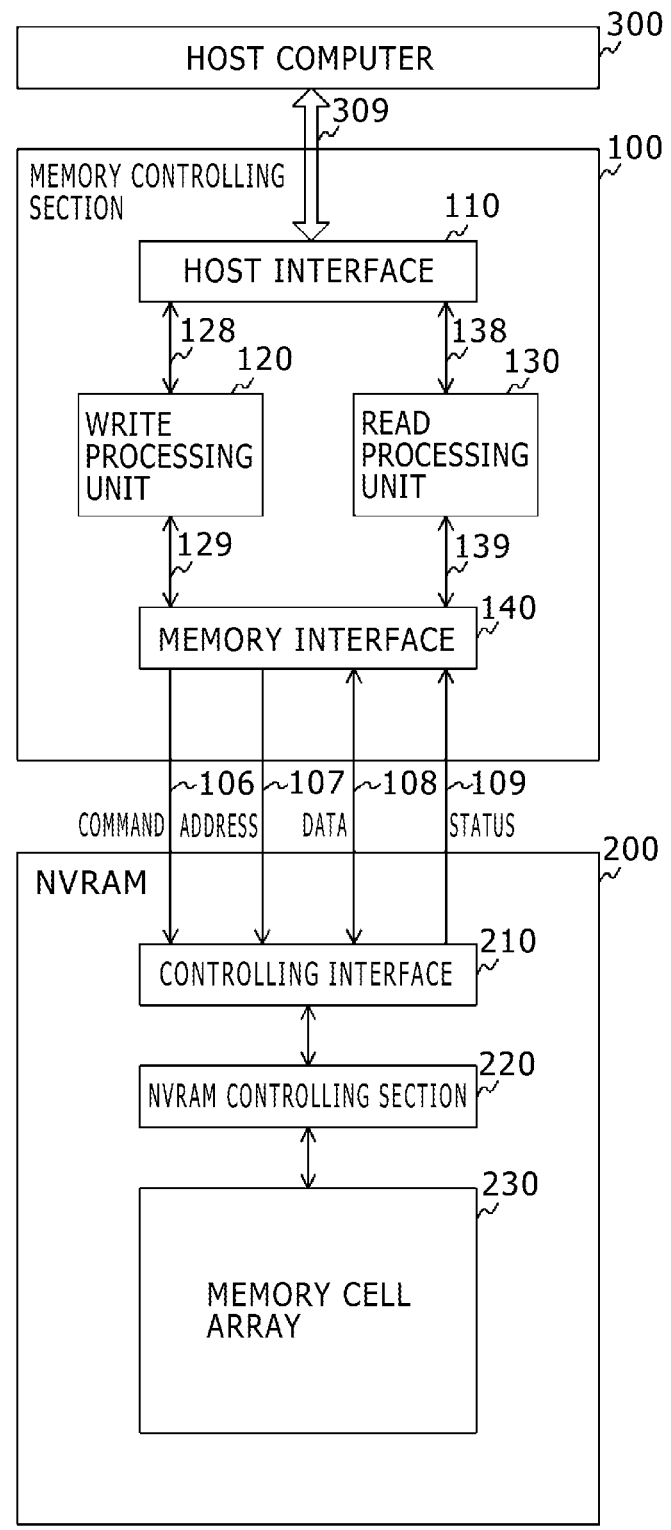

FIG.30A

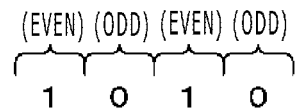

FIG.30B

| DATA N (HEXADECIMAL) | DATA N (BINARY) | NUMBER OF 0s IN ODD-NUMBERED BIT COLUMNS | NUMBER OF 0s IN EVEN-NUMBERED BIT COLUMNS | DECISION BIT |
|---|---|---|---|---|
| 0 | 0000 | 2 | 2 | 0 EVEN-NUMBERED COLUMNS |
| 1 | 0001 | 1 | 2 | 0 EVEN-NUMBERED COLUMNS |
| 2 | 0010 | 2 | 1 | 1 ODD-NUMBERED COLUMNS |
| 3 | 0011 | 1 | 1 | 0 EVEN-NUMBERED COLUMNS |
| 4 | 0100 | 1 | 2 | 0 EVEN-NUMBERED COLUMNS |
| 5 | 0101 | 0 | 2 | 0 EVEN-NUMBERED COLUMNS |
| 6 | 0110 | 1 | 1 | 0 EVEN-NUMBERED COLUMNS |
| 7 | 0111 | 0 | 1 | 0 EVEN-NUMBERED COLUMNS |
| 8 | 1000 | 2 | 1 | 1 ODD-NUMBERED COLUMNS |
| 9 | 1001 | 1 | 1 | 0 EVEN-NUMBERED COLUMNS |
| 10 | 1010 | 2 | 0 | 1 ODD-NUMBERED COLUMNS |
| 11 | 1011 | 1 | 0 | 1 ODD-NUMBERED COLUMNS |
| 12 | 1100 | 1 | 1 | 0 EVEN-NUMBERED COLUMNS |
| 13 | 1101 | 0 | 1 | 0 EVEN-NUMBERED COLUMNS |
| 14 | 1110 | 1 | 0 | 1 ODD-NUMBERED COLUMNS |
| 15 | 1111 | 0 | 0 | 0 EVEN-NUMBERED COLUMNS |

FIG.31

| DATA N (HEXADECIMAL) | DATA N (BINARY) | DECISION BIT | MASK DATA A FOR EVEN-NUMBERED COLUMN INVERSION | $N_A'$ (N XOR A) | NUMBER OF 0s in $N_A'$ | MASK DATA B FOR ODD-NUMBERED COLUMN INVERSION | $N_B'$ (N XOR B) | NUMBER OF 0s in $N_B'$ |
|---|---|---|---|---|---|---|---|---|
| 0 | 0000 | 0 EVEN-NUMBERED COLUMNS | 1010 | 1010 | 2 | 0101 | — | — |
| 1 | 0001 | 0 EVEN-NUMBERED COLUMNS | | 1011 | 1 | | — | — |
| 2 | 0010 | 1 ODD-NUMBERED COLUMNS | | — | — | | 0111 | 1 |
| 3 | 0011 | 0 EVEN-NUMBERED COLUMNS | | 1001 | 2 | | — | — |
| 4 | 0100 | 0 EVEN-NUMBERED COLUMNS | | 1110 | 1 | | — | — |
| 5 | 0101 | 0 EVEN-NUMBERED COLUMNS | | 1111 | 0 | | — | — |
| 6 | 0110 | 0 EVEN-NUMBERED COLUMNS | | 1100 | 2 | | — | — |
| 7 | 0111 | 0 EVEN-NUMBERED COLUMNS | | 1101 | 1 | | — | — |
| 8 | 1000 | 1 ODD-NUMBERED COLUMNS | | — | — | | 1101 | 1 |
| 9 | 1001 | 0 EVEN-NUMBERED COLUMNS | | 0011 | 2 | | — | — |
| 10 | 1010 | 1 ODD-NUMBERED COLUMNS | | — | — | | 1111 | 0 |
| 11 | 1011 | 1 ODD-NUMBERED COLUMNS | | — | — | | 1110 | 1 |
| 12 | 1100 | 0 EVEN-NUMBERED COLUMNS | | 0110 | 2 | | — | — |
| 13 | 1101 | 0 EVEN-NUMBERED COLUMNS | | 0111 | 1 | | — | — |
| 14 | 1110 | 1 ODD-NUMBERED COLUMNS | | — | — | | 1011 | 1 |
| 15 | 1111 | 0 EVEN-NUMBERED COLUMNS | | 0101 | 2 | | — | — |

STORAGE CONTROLLING APPARATUS, MEMORY SYSTEM, INFORMATION PROCESSING SYSTEM AND STORAGE CONTROLLING METHOD

BACKGROUND

The present technology relates to a storage controlling apparatus, a memory system, an information processing system and a storage controlling method. Particularly, the present technology relates to a storage controlling apparatus, a memory system, an information processing system and a storage controlling method for controlling a non-volatile memory.

In information processing systems in recent years, a non-volatile memory (NVM) is sometimes used as an auxiliary storage apparatus or a storage. Such non-volatile memories are roughly divided into a flash memory ready for data accessing in a great size as a unit and a non-volatile random access memory (NVRAM) with which high-speed random accessing can be carried out in a small unit. Here, as a representative example of the flash memory, a NAND type flash memory is available. On the other hand, as an example of the non-volatile random access memory, a ReRAM (Resistance RAM), a PCRAM (Phase-Change RAM), a MRAM (Magnetoresistive RAM) and so forth are available.

The non-volatile memories described above include a memory in which rewriting of a bit of one of binary values and rewriting of the other one of the binary values are carried out in order in a writing process. In such a non-volatile memory such as, for example, the ReRAM, the maximum value of power consumption in each rewriting increases as the number of bits to be rewritten increases. In order to reduce the maximum power consumption, a semiconductor device has been proposed in which that one of inverted write data and non-inverted write data which includes a smaller number of bits to be rewritten is selected and the selected write data is written into a non-volatile memory. A semiconductor device of the type described is disclosed, for example, in PCT Patent Publication No. 2006/106577.

The semiconductor device described above reads out data already written at an address of a writing destination and retains the read out data into a buffer. Then, the semiconductor device inverts write data and further retains the write data before and after the inversion into the buffer. The semiconductor device compares the write data before and after the inversion with the read out data, and writes that write data which indicates a smaller number of changing bits from between the write data before and after the inversion. If the changing bit number decreases by writing of the inverted data, then the maximum value of the power consumption reduced.

SUMMARY

However, the semiconductor device described above has a problem in that the speed of the writing process drops. In the semiconductor device, a process of comparing read out data with write data before and after inversion is executed before writing, and the speed of the writing process drops by a period of time for the comparison process. On the other hand, if the comparison process is not carried out, then the semiconductor device cannot determine whether or not the changing bit number decreases by the inversion. In this instance, even if the inversion is carried out, the changing bit number sometimes becomes greater than that before the inversion, and therefore, the maximum value of the power consumption does not decrease. Consequently, the semiconductor device has a problem that the drop of the speed of the writing process cannot be suppressed while the maximum power consumption is reduced.

Therefore, it is desirable to provide a technology which can reduce maximum power consumption while suppressing the drop of the speed of a writing process into a nonvolatile memory.

According to an embodiment of the present technology, there is provided a storage controlling apparatus including: a decision portion configured to decide whether or not a bit number of a specific value from between binary values is greater than a reference value in at least part of input data to a memory cell, which executes rewriting to one of the binary values and rewriting to the other one of the binary values in order in a writing process, to generate decision data indicative of a result of the decision; and a write side outputting portion configured to output, when it is decided that the bit number is greater than the reference value, the input data at least part of which is inverted as write data to the memory cell together with the decision data. In the storage controlling apparatus, when the bit number of the specific value is greater than the reference value, the input data at least part of which is inverted is outputted as the write data.

The storage controlling apparatus may be configured such that the reference value is one half of the number of all bits of the input data; the decision portion decides whether or not the number of bits of the specific value from among all bits is greater than the reference value; and the write side outputting portion inverts and outputs, when it is decided that the bit number is greater than the reference value, the input data as the write data, but outputs, when it is decided that the bit number is not greater than the reference value, the input data as the write data without inverting the input data. In the storage controlling apparatus, when the bit number of the specific value is greater than the one half of the number of all bits of the input data, the inverted input data is outputted as the write data.

The storage controlling apparatus may be configured such that the input data is configured from two portions; the decision portion decides whether or not the bit number is greater than the reference value at one of the two portions; the reference value is the bit number of the specific value at the other one of the two portions; and the write side outputting portion outputs, when it is decided that the bit number is greater than the reference value, the input data the one portion of which is inverted as the write data, but outputs, when it is decided that the bit number is not greater than the reference value, the input data the other one portion of which is inverted as the write data. In the storage controlling apparatus, when the bit number of the specific value is greater than one half of the total bit number of the input data, the data the one portion of which is inverted is outputted as the write data.

The storage controlling apparatus may be configured such that it further includes a data acquisition unit configured to acquire data and the decision data corresponding to the data from the memory cell; and a read side outputting portion configured to invert, when the decision data indicates that the bit number is greater than the reference value, at least part of the acquired data and output the resulting data as read data. In the storage controlling apparatus, if the decision data indicates that the bit number is greater than the reference value, the acquired data at least part of which is inverted is outputted as the read data.

The storage controlling apparatus may be configured such that it further includes a buffer configured to retain the read data and the decision data corresponding to the read data, and that the write side outputting portion reads out the read data and the decision data from the buffer and outputs, when the decision data indicates that the bit number is greater than the reference value, the read data at least part of which is inverted as the write data. In the storage controlling apparatus, the read data and the decision data are retained into the buffer, and when the decision data indicates that the bit number is greater than the reference value, the acquired data at least part of which is inverted is outputted as the read data.

The storage controlling apparatus may be configured such that it further includes a buffer configured to retain the read data, and that a major bit decision portion reads out the read data from the buffer and further decides whether or not the bit number of the specific value is greater than the reference value in at least part of the read data to generate the decision data, and a write side inversion portion further outputs, when the decision data indicates that the bit number is greater than the reference value, the read data at least part of which is inverted as the write data. In the storage controlling apparatus, the read data is retained into the buffer, and it is further decided whether or not the bit number is greater than the threshold value.

The storage controlling apparatus may be configured such that it further includes a data size changing unit configured to change the number of all bits of the input data based on a data size received in notification from the memory cell, and that the major bit decision portion changes the reference value in response to the number of all changed bits. In the storage controlling apparatus, the reference value is changed in response to a change of the total bit number of the input data.

The storage controlling apparatus may be configured such that the major bit decision portion counts the number of bits of the specific value in the target data and compares the count value and the reference value with each other to decide whether or not the bit number of the specific value is greater than the reference value. In the storage controlling apparatus, the bit number of the specific value in the input data is counted, and the count value is compared with the reference value.

According to another embodiment of the present technology, there is provided a memory system including: a memory cell configured to execute rewriting into one of binary values and rewriting into the other one of the binary values in order in a writing process; a decision portion configured to decide whether or not a bit number of a specific value from between the binary values is greater than a reference value in at least part of input data to the memory cell to generate decision data indicative of a result of the decision; and a write side outputting portion configured to output, when it is decided that the bit number is greater than the reference value, the input data at least part of which is inverted as write data to the memory cell together with the decision data. In the memory system, when the bit number of the specific value is greater than the reference value, the input data at least part of which is inverted is outputted as the write data.

According to a further embodiment of the present technology, there is provided an information processing system including: a host computer configured to issue a write command for an instruction of a writing process of input data; a memory cell configured to execute rewriting into one of binary values and rewriting into the other one of the binary values in order in the writing process; a decision portion configured to decide whether or not a bit number of a specific value from between the binary values is greater than a reference value in at least part of the input data to generate decision data indicative of a result of the decision; and a write side outputting portion configured to output, when it is decided that the bit number is greater than the reference value, the input data at least part of which is inverted as write data to the memory cell together with the decision data. In the information processing system, when the bit number of the specific value is greater than the reference value, the input data at least part of which is inverted is outputted as the write data.

According to a still further embodiment of the present technology, there is provided a storage controlling method including: deciding, by a decision portion, whether or not a bit number of a specific value from between binary values is greater than a reference value in at least part of input data to a memory cell, which executes rewriting into one of the binary values and rewriting into the other one of the binary values in order in a writing process, to generate decision data indicative of a result of the decision; and outputting, by a write side outputting portion, when it is decided that the bit number is greater than the reference value, the input data at least part of which is inverted as write data to the memory cell together with the decision data.

With the storage controlling apparatus, memory system, information processing system, and storage controlling method according to the present technology, a superior advantage can be achieved that the maximum power consumption can be reduced while a drop of the speed of the writing process into the nonvolatile memory is suppressed.

BRIEF DESCRIPTION OF THE DRAWINGS

FIG. 1 is a block diagram showing an example of a configuration of an information processing system according to a first embodiment;

FIGS. 30A and 30B are views illustrating an example of data and a decision bit in the fifth embodiment;

FIG. 31 is a view illustrating an example of data obtained by inverting one of an odd-numbered bit column and an even-numbered bit column in the fifth embodiment;

DETAILED DESCRIPTION OF THE PREFERRED EMBODIMENTS

Figure 2:
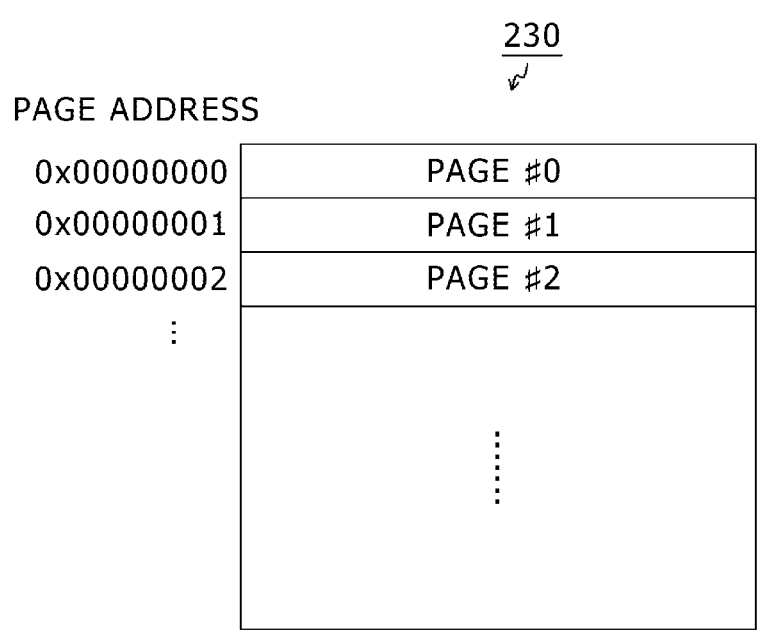
FIG. 2 is a view illustrating an example of an access unit of a NVRAM in the first embodiment.

In the following, preferred embodiments for carrying out the present technology are described. The description is given in the following order.

1. First Embodiment (Example Wherein Write Data Is Inverted in Response to the Number of Bits of a Specific Value)

2. Second Embodiment (Example Wherein Write Data of a Set Data Size Is Inverted)

3. Third Embodiment (Example Wherein Write Data Retained in the Page Buffer Is Inverted)

4. Forth Embodiment (Example Wherein Write Data Is Inverted in Response to the Number of "0" Bits in Write Data Retained in the Page Buffer)

5. Fifth Embodiment (Example Wherein Part of Write Data Is Inverted)

6. Modification (Example Wherein Part of Write Data Is Inverted and Then a Decision Bit Is Generated)

1. First Embodiment

Example of the Configuration of the Information Processing System

FIG. 1 is a block diagram showing an example of a configuration of an information processing system according to a first embodiment. Referring to FIG. 1, the information processing system includes a host computer 300 and a memory system. The memory system includes a memory controlling section 100 and a NVRAM 200.

The host computer 300 controls the memory system. In particular, the host computer 300 issues a command and supplies the command, an address and data to the memory controlling section 100 through a signal line 309. Further, the host computer 300 accepts data and a status from the memory system. Here, the command controls the memory system and includes, for example, a write command instructive of a writing process of data and a read command instructive of a reading process of data. The address indicates a storage place of data in the NVRAM 200. The data is inputted to the memory system or read data read out from the memory system. The status is information for the notification of a result of execution of a command or a situation of the memory system.

The memory controlling section 100 controls the NVRAM 200 and includes a host interface 110, a write processing unit 120, a read processing unit 130 and a memory interface 140. It is to be noted that the memory controlling section 100 is an example of a storage controlling apparatus.

The host interface 110 transfers a command, an address, data, a status and so forth to and from the host computer 300.

If the host interface 110 receives a command and an address from the host computer 300, then it decodes the command, and if the decoded command is a write command, then the host interface 110 supplies the write command and the address to the write processing unit 120 through a signal line 128. On the other hand, if a read command is received, then the host interface 110 supplies the read command and the address to the read processing unit 130 through a signal line 138.

Further, the host interface 110 supplies data received from the host computer 300 to the write processing unit 120 and transfers read data received from the read processing unit 130 to the host computer 300. Further, if the host interface 110 receives a status through the write processing unit 120 and the read processing unit 130, then the host interface 110 transfers the status to the host computer 300. As the host interface 110, for example, the SATA (Serial Advanced Technology Attachment), the PCI Express and so forth can be utilized.

The write processing unit 120 executes a writing process for writing write data into the NVRAM 200. If the write processing unit 120 receives a write command, an address and data through the host interface 110, then it supplies the write command and the address to the memory interface 140. Then, every time data of n (n is, for example, 16×8) bits is inputted to the write processing unit 120, the write processing unit 120 counts the number of bits of a specific value, such as, for example, "0," from between binary values in the data. The write processing unit 120 compares the counted bit number with n/2 to decide whether or not the bit of the specific value is a major bit. Here, the major bit is a bit whose number is greater than n/2 in data of n bits from between the bit of the value of "0" and the bit of the value of "1." If the bit numbers of "0" and "1" are equal to each other, then it is decided that the data does not include a major bit and decided that the bit of the specific value, for example, "0," is not the major bit. The write processing unit 120 generates a decision bit representative of a result of the decision. If the counted bit number is greater than n/2, namely, if the major bit is "0," then the data is inverted. The write processing unit 120 determines the data after or before the inversion as write data and generates an error correcting code (ECC) with regard to the write data and the decision bit. The write processing unit 120 determines data configured from the error correcting code and the decision bit as redundant data and supplies the write data and the redundant data to the memory interface 140 through a signal line 129. It is to be noted that, although the write processing unit 120 counts the number of bits of "0" in the data and decides whether or not the count value is greater than n/2, the write processing unit 120 may otherwise count the number of bits of "1" in the data and decides whether or not the count value is greater than n/2.

The write processing unit 120 further supplies a status received from the memory interface 140 to the host interface 110.

The read processing unit 130 executes a reading process for reading out data from the NVRAM 200. If the read processing unit 130 receives a read command and an address through the host interface 110, then it supplies them to the memory interface 140. Then, if the read processing unit 130 receives data and redundant data from the memory interface 140, then it decides whether or not the major bit is "0" from the decision bit in the redundant data. If it is decided that the major bit is "0," then the read processing unit 130 inverts the data. The read processing unit 130 supplies the data before or after the inversion as read data to the host interface 110 through the signal line 138.

Further, the read processing unit 130 supplies a status received from the memory interface 140 to the host interface 110.

The memory interface 140 transfers a command, an address, data, a status and so forth to and from the NVRAM 200. In particular, the memory interface 140 transfers a command, an address and data received from the write processing unit 120 to the NVRAM 200 through signal lines 106, 107 and 108, respectively. Then, the memory interface 140 supplies a status transferred thereto from the NVRAM 200 through a signal line 109 to the write processing unit 120. Further, the memory interface 140 transfers a command and an address received from the read processing unit 130 to the NVRAM 200 and supplies data and a status transferred thereto from the NVRAM 200 to the read processing unit 130. It is to be noted that the memory interface 140 is an example of a data acquisition unit.

The NVRAM 200 includes a controlling interface 210, a NVRAM controlling section 220 and a memory cell array 230.

The controlling interface 210 transfers a command, an address, data, a status and so forth to and from the memory controlling section 100.

The NVRAM controlling section 220 controls the entire NVRAM 200. In particular, if the NVRAM controlling section 220 receives a write command, an address and write data through the controlling interface 210, then it reads out data written at the address as written data. This reading is referred to as pre-reading. The NVRAM controlling section 220 compares the write data and the written data in a unit of a bit and determines those bits which have the value of "1" in the write data and have the value of "0" in the written data as a rewriting target. The NVRAM controlling section 220 rewrites the bits of the rewriting target into "1." This process is hereinafter referred to as resetting process. Then, the NVRAM controlling section 220 compares the write data and the written data after the setting process in a unit of a bit with each other and determines those bits which have the value of "0" in the write data and have the value of "1" in written data as a writing target. The NVRAM controlling section 220 rewrites the bits of the rewriting target into "0." This process is hereinafter referred to as setting process. On the other hand, if the NVRAM controlling section 220 receives redundant data through the controlling interface 210, then it carries out writing in a procedure similar to that when write data is written.

It is to be noted that, although the NVRAM controlling section 220 carries out the setting process after the resetting process, it may otherwise execute the resetting process after the setting process. Further, while the process of rewriting "1" into "0" is referred to as setting process and the process of rewriting "0" into "1" is referred to as resetting process, the names of the processes are not limited to the resetting process and the setting process. For example, the process corresponding to the setting process is referred to also as erasing process. On the other hand, the process corresponding to the resetting process is referred to also as programming process.

In the meantime, if the NVRAM controlling section 220 receives a read command and an address through the controlling interface 210, then it reads out data from the corresponding address in the memory cell array 230 and transfers the data to the memory controlling section 100.

Further, the NVRAM controlling section 220 generates a status in which a situation of the NVRAM 200 and a result of execution of the write command are described and transfers the status to the memory controlling section 100.

The memory cell array 230 includes a plurality of arrayed memory cells. For example, a ReRAM is used as each of the memory cells. It is to be noted that a nonvolatile memory other than the ReRAM may be used in the memory cell array 230 if a setting process and a resetting process are executed in order in the writing process by the nonvolatile memory.

FIG. 2 illustrates an example of an access unit of the NVRAM 200 in the first embodiment. As seen in FIG. 2, the memory cell array 230 in the NVRAM 200 is configured from a plurality of pages. A predetermined address is allocated to each storage place of each page.

Figure 3:
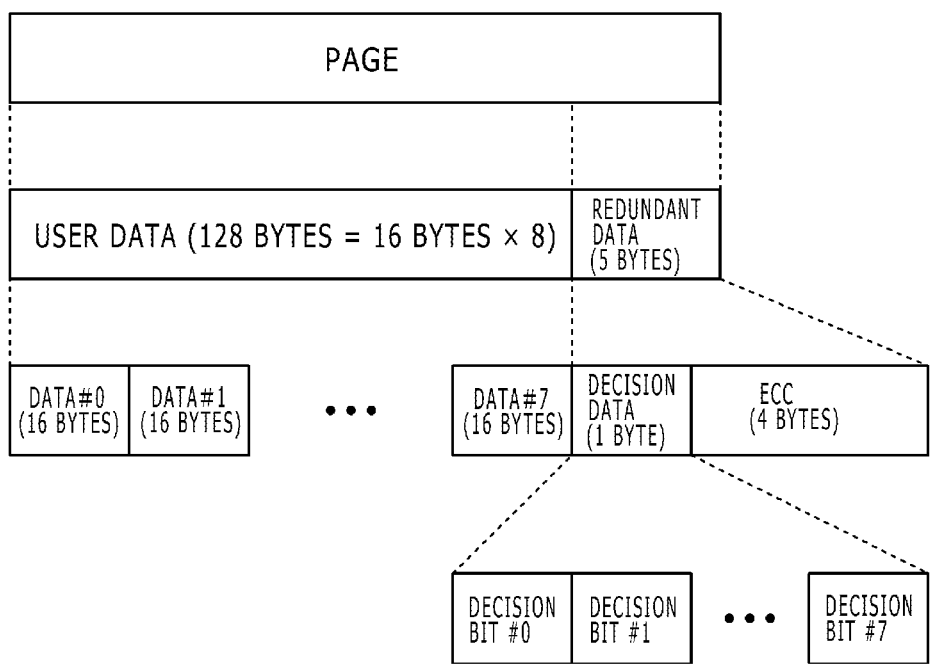
FIG. 3 is a view illustrating an example of a data structure of a page in the first embodiment.

FIG. 3 illustrates an example of a data structure of a page in the first embodiment. Each page includes user data and redundant data of the user data. The user data is configured from a plurality of data of a predetermined size. For example, the user data is data of 128 bytes configured from eight data of 16 bytes. Meanwhile, the redundant data includes decision data and an error correction code. The decision data is configured from a plurality of decision bits corresponding to a plurality of data in the user data. The decision bits represent whether or not the number of bits of a specific value such as, for example, "0" is greater than n/2. For example, in the case where the user data is configured from eight data, the decision bits are configured from eight decision bits corresponding to the user data. The error correction code is data for detecting and correcting an error in the user data and the decision data.

Example of the Configuration of the Write Processing Unit

Figure 4:
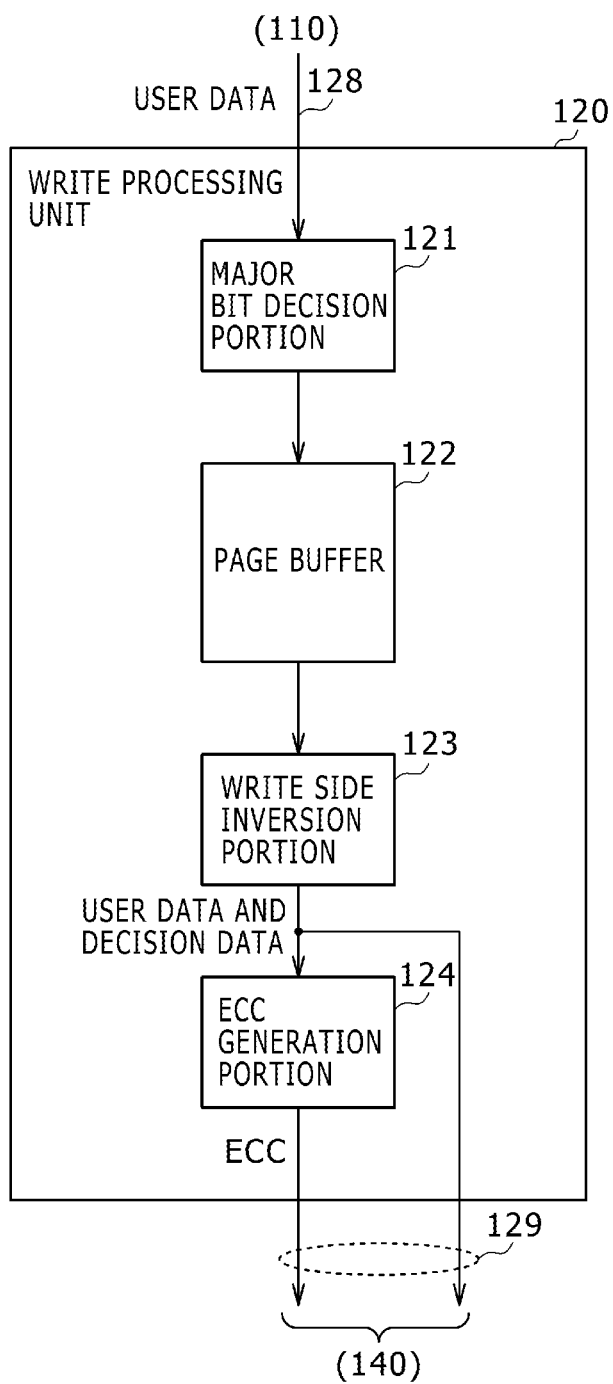
FIG. 4 is a block diagram showing an example of a configuration of a write processing unit shown in FIG. 1.

FIG. 4 is a block diagram showing an example of a configuration of the write processing unit 120 in the first embodiment. Referring to FIG. 4, the write processing unit 120 shown includes a major bit decision portion 121, a page buffer 122, a write side inversion portion 123 and an ECC generation portion 124.

The major bit decision portion 121 counts the number of bits of a predetermined value such as, for example, "0" from between binary values in each of the data in the user data and compares the counted bit number with n/2 to decide whether or not the bit of the specific value is a major bit. The major bit decision portion 121 generates a decision bit representative of a result of the decision regarding each data in the user data and retains the data and the decision bits corresponding to the data into the page buffer 122. For example, if the number of bits of "0" is greater than n/2, namely, if the major bit is "0," then a decision bit of "0" is generated, but if the number of bits of "0" is equal to or smaller than n/2, namely, if the major bit is not "0," then a decision bit of "1" is generated. It is to be noted that the major bit decision portion 121 is an example of a decision portion.

The page buffer 122 retains a page including a plurality of data and decision bits of the data.

The write side inversion portion 123 inverts data retained in the page buffer 122 based on decision bits of the data as occasion demands. The write side inversion portion 123 first reads out each data and a corresponding decision bit from the page buffer 122. Then, if the decision bit indicates that the major bit is "0," then the write side inversion portion 123 inverts the data to determine write data but determines, in any other case, the data not inverted as write data. The write side inversion portion 123 supplies user data configured from a plurality of write data and decision data configured from a plurality of decision bits to the ECC generation portion 124 and the memory interface 140. It is to be noted that the write side inversion portion 123 is an example of a write side outputting portion.

The ECC generation portion 124 generates an error correction code regarding user data and decision data. The ECC generation portion 124 supplies the generated error correction code to the memory interface 140.

Example of the Configuration of the Read Processing Unit

Figure 5:
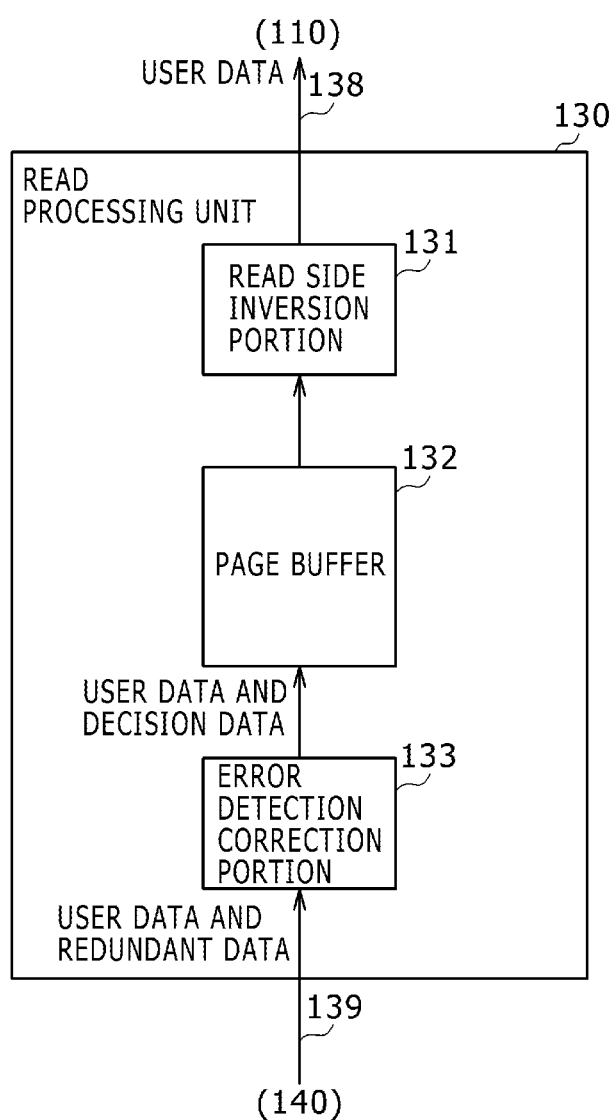
FIG. 5 is a block diagram showing an example of a configuration of a read processing unit shown in FIG. 1.

FIG. 5 is a block diagram showing an example of a configuration of the read processing unit 130 in the first embodiment. Referring to FIG. 5, the read processing unit 130 shown includes a read side inversion portion 131, a page buffer 132 and an error detection correction portion 133.

The error detection correction portion 133 uses an error correction code in the redundant data to detect errors in the user data and the decision data and corrects the errors if the errors are correctable. After the error detection and correction are carried out, the error detection correction portion 133 retains resulting user data and decision data into the page buffer 132.

The page buffer 132 retains a page including user data and decision data.

The read side inversion portion 131 inverts data retained in the page buffer 132 based on decision bits regarding the data as occasion demands. The read side inversion portion 131 first reads out data and a decision bit of the data from the page buffer 132. Then, if the decision bit indicates that the major bit in the data before the inversion is "0," then the read side inversion portion 131 inverts the data to determine read data but determines, in any other case, the data not inverted as read data. The read side inversion portion 131 supplies user data including the read data to the host interface 110. The read side inversion portion 131 is an example of a read side outputting portion.

Figure 6:
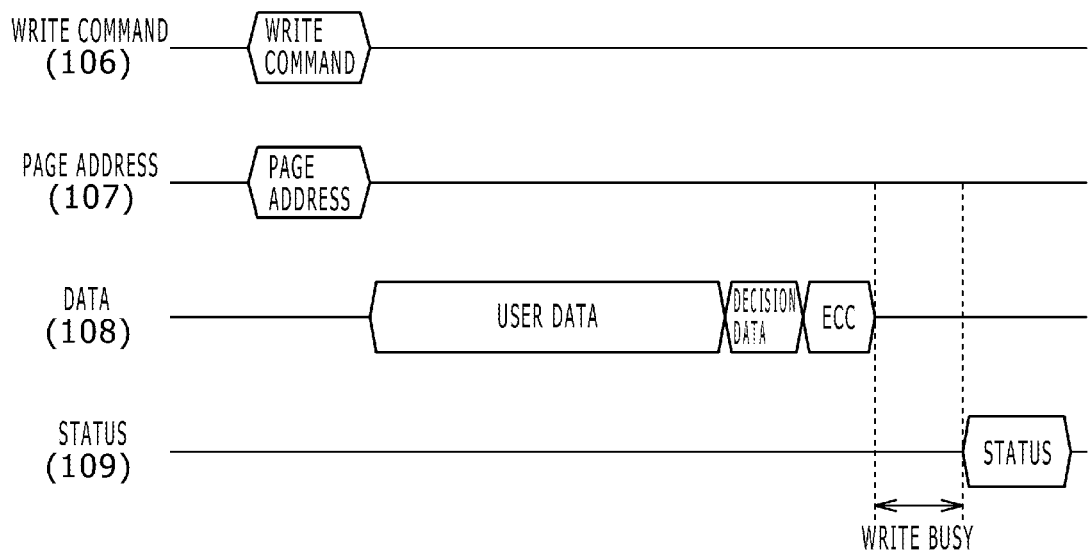
FIG. 6 is a timing chart illustrating an example of data transferred in a writing process in the first embodiment.

FIG. 6 illustrates an example of data transferred in a writing process in the first embodiment. The memory controlling section 100 transfers a write command and a page address to the NVRAM 200 through the signal lines 106 and 107. Then, the memory controlling section 100 generates decision data and an error correction code from user data and transfers a page including the generated decision data and error correction code to the NVRAM 200 through the signal line 108. The NVRAM 200 writes the page transferred thereto into a page address and transfers a status which describes a result of the writing process to the memory controlling section 100 through the signal line 109. In this manner, in the writing process, a write command, a page address, user data and so forth are transferred from the memory controlling section 100 to the NVRAM 200, and then a status is transferred from the NVRAM 200 to the memory controlling section 100.

Figure 7:
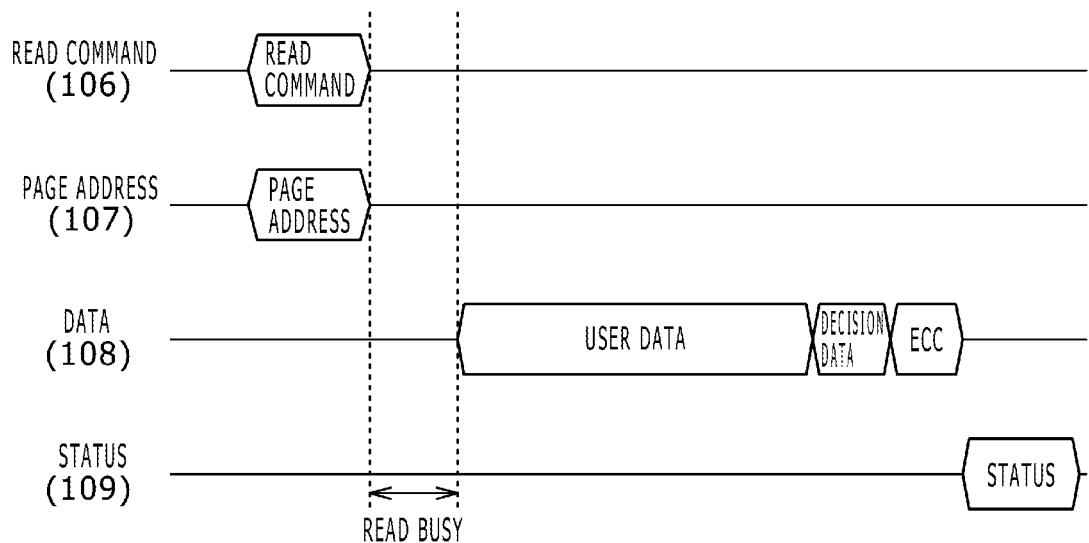
FIG. 7 is a timing chart illustrating an example of data transferred in a reading process in the first embodiment.

FIG. 7 illustrates an example of data transferred in a reading process in the first embodiment. The memory controlling section 100 transfers a read command and a page address to the NVRAM 200 through the signal lines 106 and 107. The NVRAM 200 reads out a page including user data, decision data and an error correction code from the page address. The NVRAM 200 transfers the read out page and a status in which a result of the reading out process is described to the memory controlling section 100 through the signal lines 108 and 109. In this manner, in the reading process, a read command and a page address are transferred from the memory controlling section 100 to the NVRAM 200, and then user data and so forth and a status are transferred from the NVRAM 200 to the memory controlling section 100.

Example of Operation of the Memory System

Figure 8:
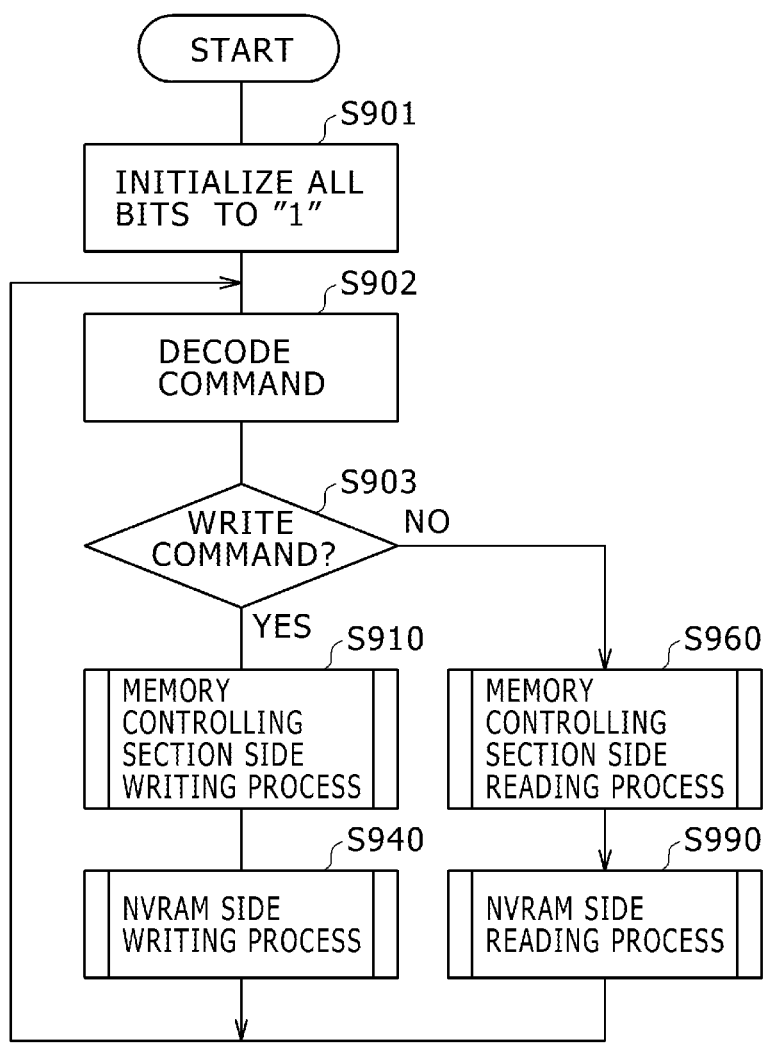
FIG. 8 is a flow chart illustrating an example of operation of a memory system in the first embodiment.

FIG. 8 is a flow chart illustrating an example of operation of the memory system in the first embodiment. This operation is started, for example, when an instruction for the initialization is issued from the host computer 300 to the memory system.

Referring to FIG. 8, the NVRAM 200 initializes all bits in the memory cell array 230 to the value of "1" at step S901. Then, the memory controlling section 100 decodes a command from the host computer 300 at step S902. Then, the memory controlling section 100 decides, when it receives a command from the host computer 300, whether or not the command is a write command at step S903. Here, it is assumed that the command from the host computer 300 is one of a write command and a read command. It is to be noted that, although the NVRAM 200 initializes all bits to the value of "1," it may otherwise initialize all bits to the value of "0." In this instance, the memory controlling section 100 may decide whether or not the bit of "1" is the major bit.

If the received command is a write command at step S903 and the decision at step S903 is Yes, then the memory controlling section 100 executes a memory controlling section side writing process at step S910. Then, the NVRAM 200 executes a NVRAM side writing process at step S940.

On the other hand, if the received command is a read command at step S903 and the decision at step S903 is No, then the memory controlling section 100 executes a memory controlling section side reading process at step S960. Then, the NVRAM 200 executes a NVRAM side reading process at step S990. After the process at step S940 or S990, the memory controlling section 100 returns its processing to step S902.

Figure 9:
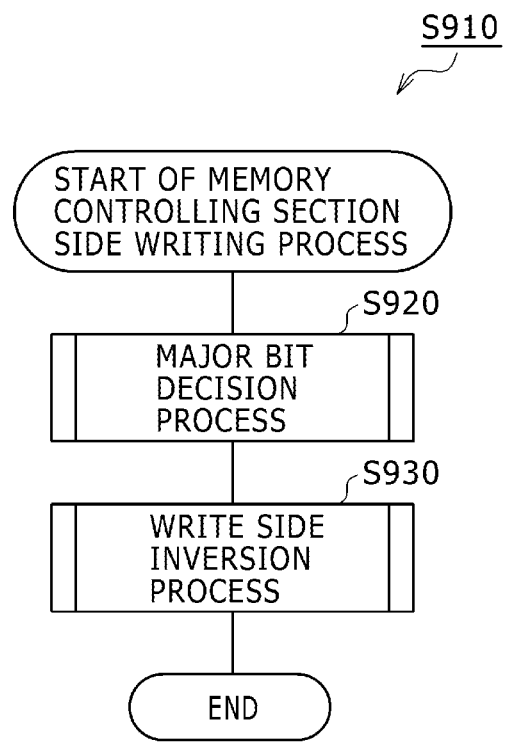
FIG. 9 is a flow chart illustrating an example of a memory controlling section side writing process in the first embodiment.

FIG. 9 is a flow chart illustrating an example of the memory controlling section side writing process at step S910 of FIG. 8. Referring to FIG. 9, the memory controlling section 100 executes a major bit decision process for deciding whether or not the bit of a specific value is the major bit at step S920. Then, the memory controlling section 100 executes a write side inversion process for inverting data as occasion demands at step S930. After the process at step S930, the memory controlling section 100 ends the memory controlling section side writing process.

Figure 10:
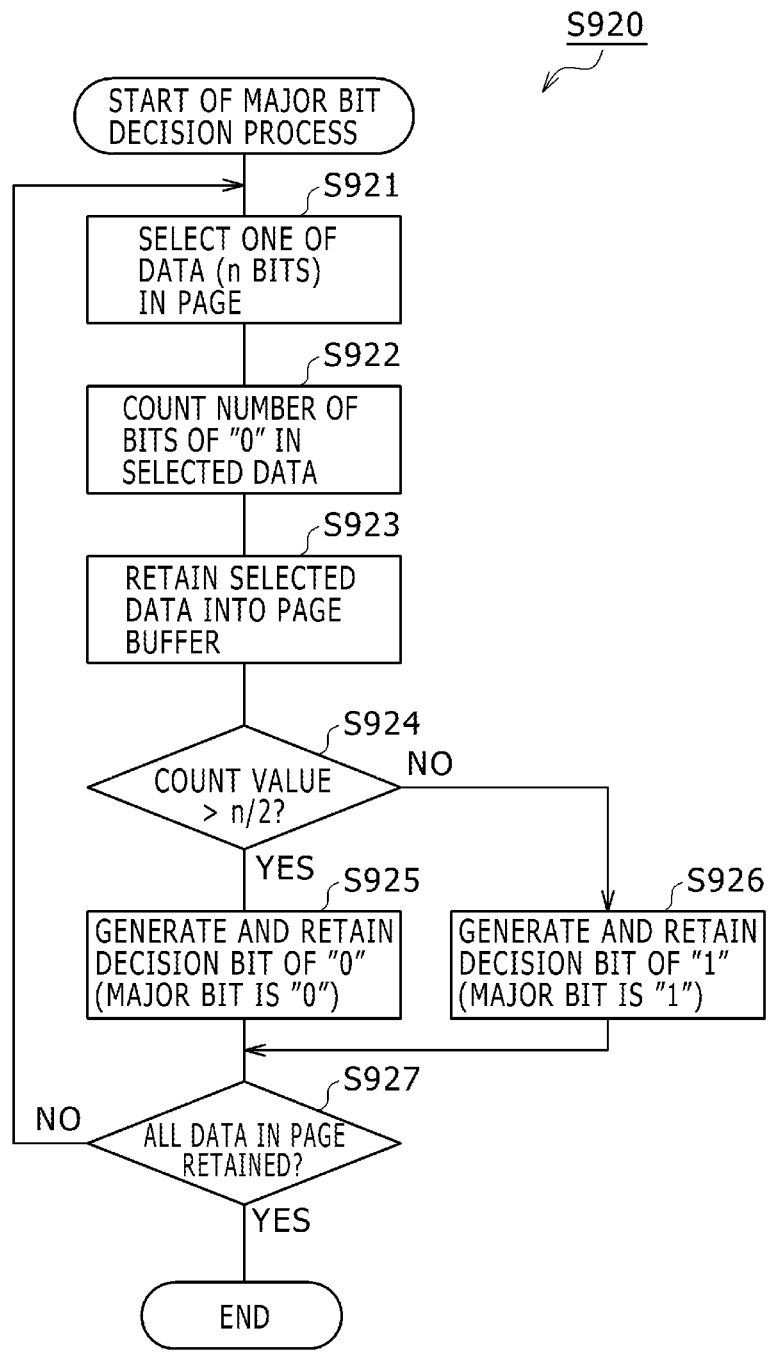
FIG. 10 is a flow chart illustrating an example of a major bit decision process illustrated in FIG. 9.

FIG. 10 is a flow chart illustrating an example of the major bit decision process at step S920 of FIG. 9. Referring to FIG. 10, the major bit decision portion 121 of the memory controlling section 100 selects data of n bits in the page at step S921. Then, the major bit decision portion 121 counts the number of bits of "0" in the selected data at step S922. Then, the major bit decision portion 121 retains the selected data into the page buffer 122 at step S923. Then, the major bit decision portion 121 decides whether or not the number of bits of "0" is greater than n/2, namely, whether or not the major bit is "0," at step S924. If the count value is greater than n/2 and the decision at step S924 is Yes, then the major bit decision portion 121 generates a decision bit of the value of "0" indicative of the fact that the major bit is "0" and retains the generated decision bit into the page buffer 122 at step S925. On the other hand, if the count value is equal to or smaller than n/2 and the decision at step S924 is No, then the major bit decision portion 121 generates a decision bit of the value of "1" indicative of the fact that the major bit is not "0" and retains the generated decision bit into the page buffer 122 at step S926.

After step S925 or S926, the major bit decision portion 121 decides whether or not all data in the page are retained in the page buffer 122 at step S927. If all data are not retained at step S927 and the decision at step S927 is No, then the major bit decision portion 121 returns the processing to step S921. On the other hand, if all data are retained at step S927 and the decision at step S927 is Yes, then the major bit decision portion 121 ends the major bit decision process.

Figure 11:
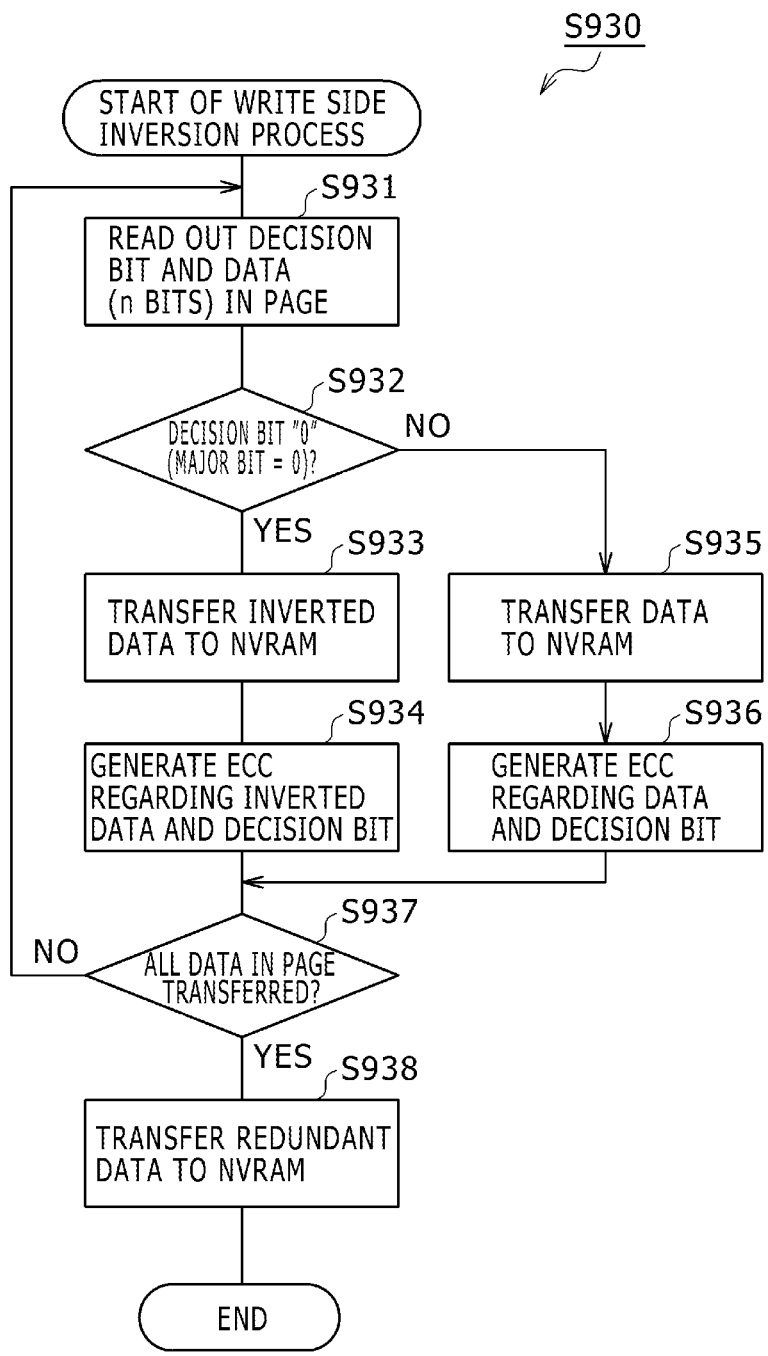
FIG. 11 is a flow chart illustrating an example of a write side inversion process illustrated in FIG. 9.

FIG. 11 is a flow chart illustrating an example of the write side inversion process at step S930 of FIG. 9. Referring to FIG. 11, the write side inversion portion 123 of the memory controlling section 100 reads out data in the page and a decision bit of the data from the page buffer 122 at step S931. Then, the write side inversion portion 123 decides whether or not the decision bit is "0," namely, if the major bit is "0," at step S932.

If the decision bit is "0" at step S932 and the decision at step S932 is Yes, then the write side inversion portion 123 inverts the data and transfers the inverted data as write data to the NVRAM 200 at step S933. Then, the write side inversion portion 123 generates an error correction code for the inverted data and the decision bit at step S934.

On the other hand, if the decision bit is "1" at step S932 and the decision at step S932 is No, then the write side inversion portion 123 transfers the data as write data to the NVRAM 200 at step S935. Then, the write side inversion portion 123 generates an error correction code for the data and the decision bit at step S936.

After step S934 or S936, the write side inversion portion 123 decides whether or not all data in the page are transferred to the NVRAM 200 at step S937. If all data are not transferred at step S937 and the decision at step S937 is No, then the write side inversion portion 123 returns the processing to step S931. On the other hand, if all data are transferred at step S937 and the decision at step S937 is Yes, then the write side inversion portion 123 transfers redundant data including the decision data and the error correction code to the NVRAM 200 at step S938. After the process at step S938, the write side inversion portion 123 ends the write side inversion process.

Figure 12:
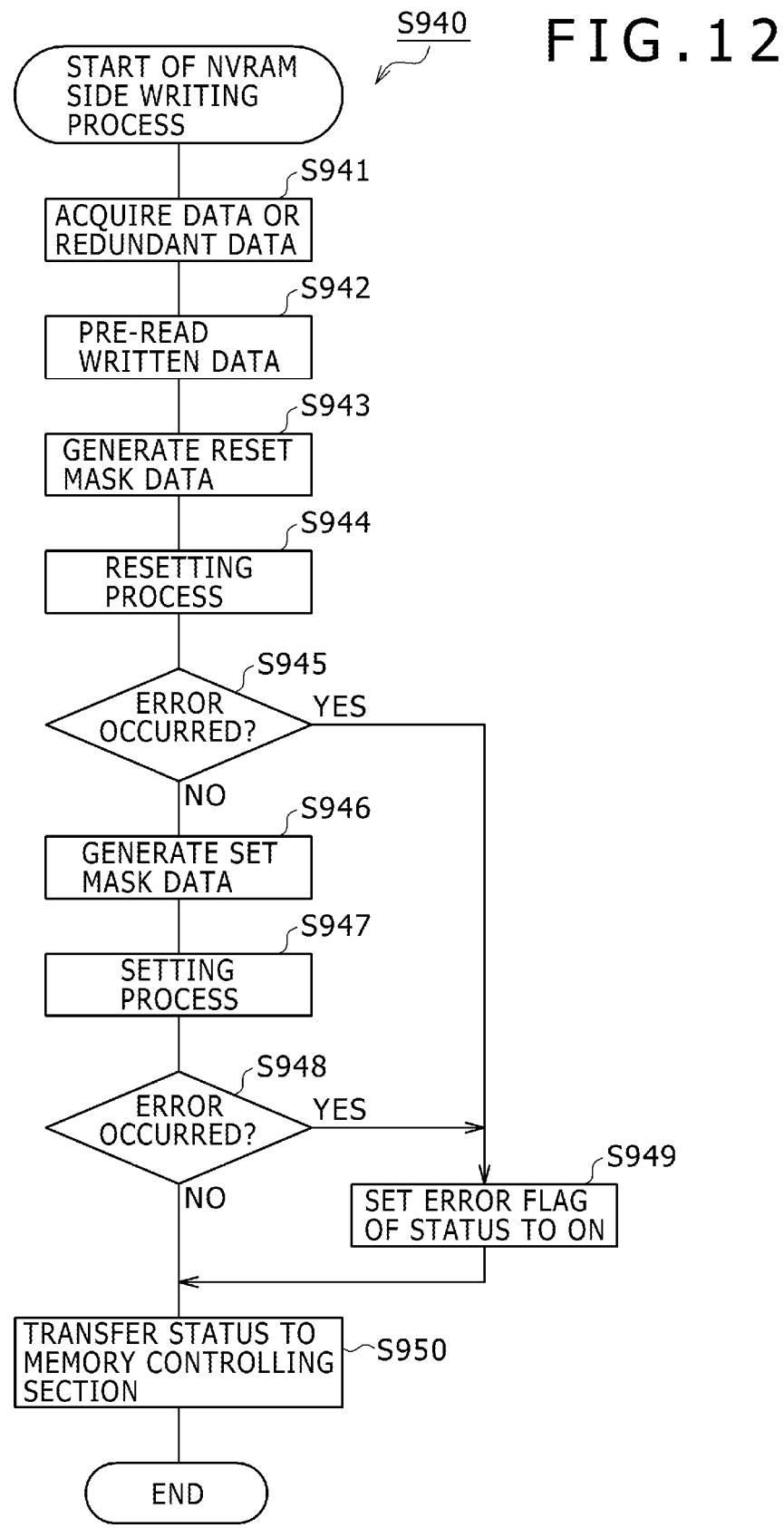
FIG. 12 is a flow chart illustrating an example of a NVRAM side writing process in the first embodiment.

FIG. 12 is a flow chart illustrating an example of the NVRAM side writing process at step S940 of FIG. 8. Referring to FIG. 12, the NVRAM 200 acquires write data or redundant data in the page at step S941. Then, the NVRAM 200 pre-reads data written in a page address of the writing destination as written data at step S942. Then, the NVRAM 200 compares corresponding bits of the write data or redundant data and the written data with each other to generate reset mask data at step S943. This reset mask data indicates that any bit which is "1" in the write data or redundant data but is "0" in the written data is to be reset while any other bit is to be masked.

The NVRAM 200 carries out a process of rewriting only those bits, whose resetting is indicated by the mask reset data, from "0" to "1," namely, a resetting process, at step S944. Then, the NVRAM 200 reads out the written data after the resetting process and decides whether or not an error is found at step S945.

If an error is not found at step S945 and the decision at step S945 is No, then the NVRAM 200 compares corresponding bits of the write data or redundant data and the written data after the resetting process with each other to generate set mask data at step S946. This set mask data indicates that any bit which is "0" in the write data or redundant data and is "1" in the written data is to be set while any other bit is to be masked.

The NVRAM 200 carries out a process of rewriting only those bits whose setting is indicated by the set mask data, from "1" into "0," namely, a setting process, at step S947. The NVRAM 200 reads out the written data after the setting process and decides whether or not an error is found at step S948.

When an error arising from the resetting process is found at step S945 and the decision at step S945 is Yes, or when an error arising from the setting process is found at step S948 and the decision at step S948 is Yes, the NVRAM 200 places an error flag in the status into an on state at step S949. This error flag is information representative of whether or not an error occurs in the writing process and is off in an initial state. If an error in the setting process is not found at step S948 and the decision at step S948 is No, or after the process at step S949, the NVRAM 200 transfers the status to the memory controlling section 100 at step S950. After the process at step S950, the NVRAM 200 ends the NVRAM side writing process.

Figure 13:
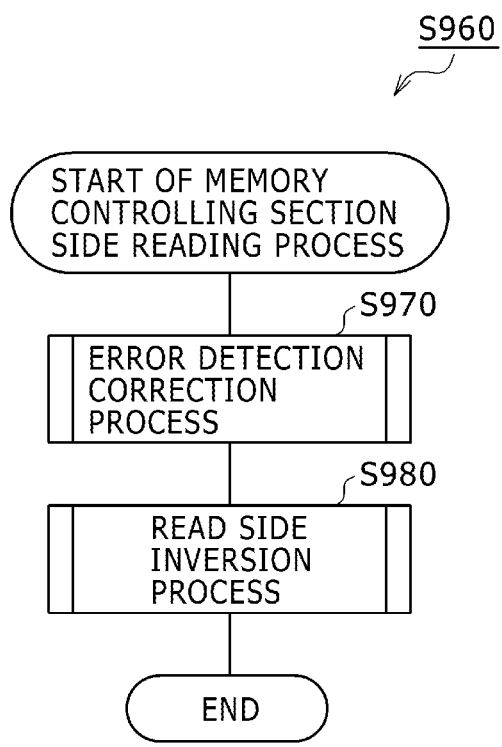
FIG. 13 is a flow chart illustrating an example of a memory controlling section side reading process in the first embodiment.

FIG. 13 is a flow chart illustrating an example of the memory controlling section side reading process at step S960 of FIG. 8. Referring to FIG. 13, the memory controlling section 100 first detects an error in the data and executes an error detection correction process for correcting the error at step S970. Then, the memory controlling section 100 executes a read side inversion process for inverting the data at step S980 as occasion demands. After the process at step S980, the memory controlling section 100 ends the memory controlling section side reading process.

Figure 14:
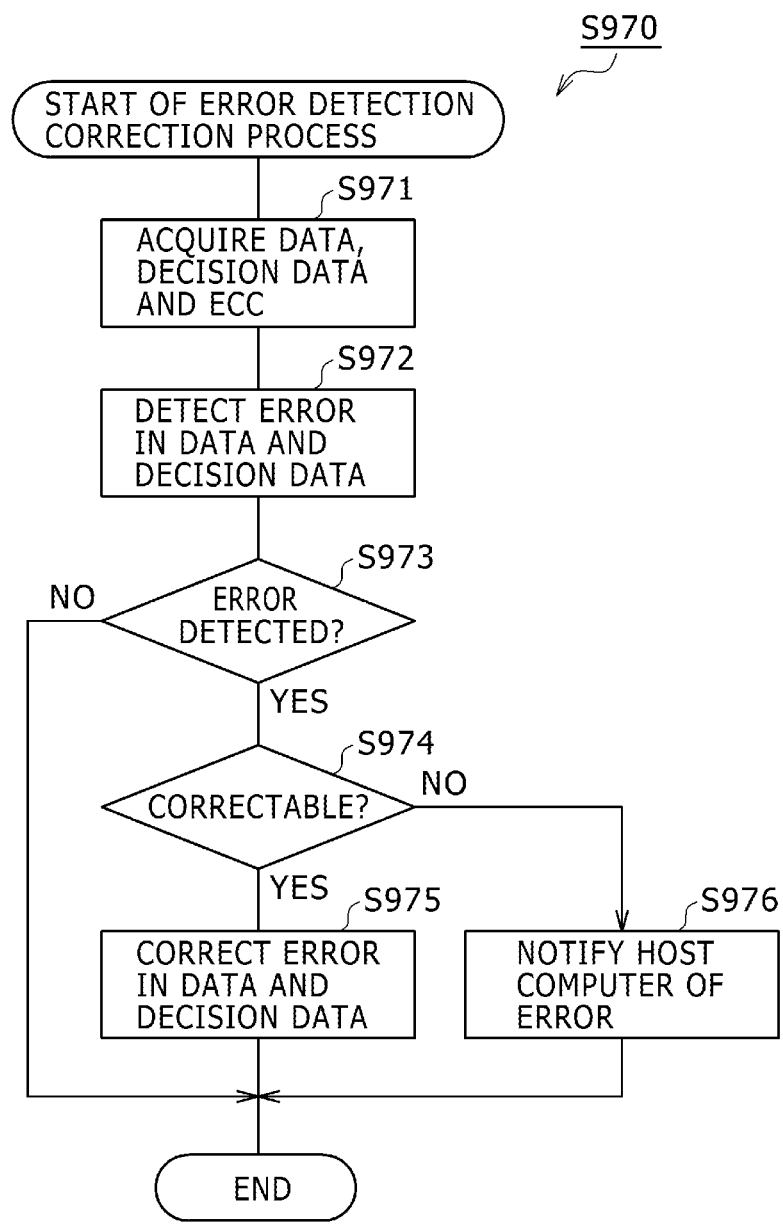
FIG. 14 is a flow chart illustrating an example of an error detection correction process illustrated in FIG. 13.

FIG. 14 is a flow chart illustrating an example of the error detection correction process at step S970 of FIG. 13. Referring to FIG. 14, the error detection correction portion 133 of the memory controlling section 100 acquires data and decision data as well as an error correction code from the NVRAM 200 at step S971. Then, the error detection correction portion 133 uses the error correction code to detect an error in the data and the decision data at step S972. Then, the error detection correction portion 133 decides whether or not the data and the decision data include an error at step S973.

If an error is found at step S973 and the decision at step S973 is Yes, then the error detection correction portion 133 decides whether or not the error is correctable at step S974. If the error is correctable at step S974 and the decision at step S974 is Yes, then the error detection correction portion 133 corrects the error in the data or the decision data at step S975. On the other hand, if the error is not correctable at step S974 and the decision at step S974 is No, then the error detection correction portion 133 notifies the host computer 300 of the error at step S976. For example, the error detection correction portion 133 places the error flag in the status transferred thereto from the NVRAM 200 into an on state and transfers the resulting error flag to the host computer 300 to notify the host computer 300 of the error.

If an error is not found at step S973 and the decision at step S973 is No, or after the process at step S975 or S976, the error detection correction portion 133 ends the error detection correction process.

Figure 15:
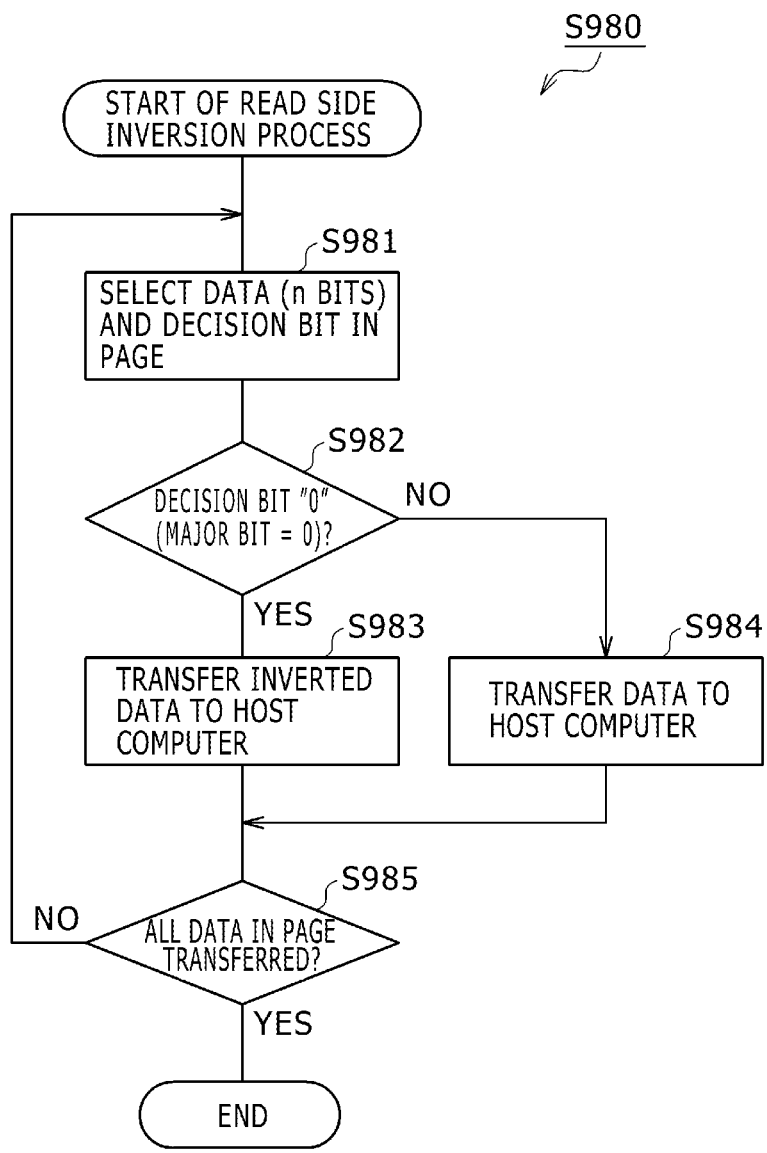
FIG. 15 is a flow chart illustrating an example of a read side inversion process illustrated in FIG. 13.

FIG. 15 is a flow chart illustrating an example of the read side inversion process at step S980 of FIG. 13. Referring to FIG. 15, the read side inversion portion 131 of the memory controlling section 100 selects data in the page and a decision bit of the data at step S981. The read side inversion portion 131 decides whether or not the decision bit is "0," namely, whether or not the major bit is "0," at step S982.

If the decision bit is "0" at step S982 and the decision at step S982 is Yes, then the read side inversion portion 131 inverts the data and transfers the inverted data as read data to the host computer 300 at step S983. On the other hand, if the decision bit is "1" at step S982 and the decision at step S982 is No, then the read side inversion portion 131 leaves the data without inverting the same and transfers the data as read data to the host computer 300 at step S984.

After step S983 or S984, the read side inversion portion 131 decides whether or not all data in the page are transferred at step S985. If all data are not transferred at step S985 and the decision at step S985 is No, then the read side inversion portion 131 returns its processing to step S981. On the other hand, if all data are transferred at step S985 and the decision at step S985 is Yes, then the read side inversion portion 131 ends the read side inversion process.

Figure 16:
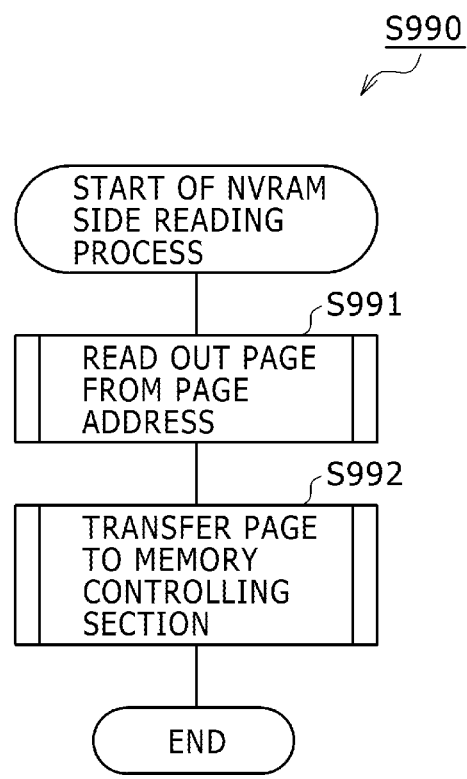
FIG. 16 is a flow chart illustrating an example of a NVRAM side reading process in the first embodiment.

FIG. 16 is a flow chart illustrating an example of the NVRAM side reading process at step S990 of FIG. 8. Referring to FIG. 16, the NVRAM 200 reads out a page from a page address received together with the read command at step S991. The NVRAM 200 transfers the read out page to the memory controlling section 100 at step S992. After the process at step S992, the NVRAM 200 ends the NVRAM side reading process.

Figure 17:
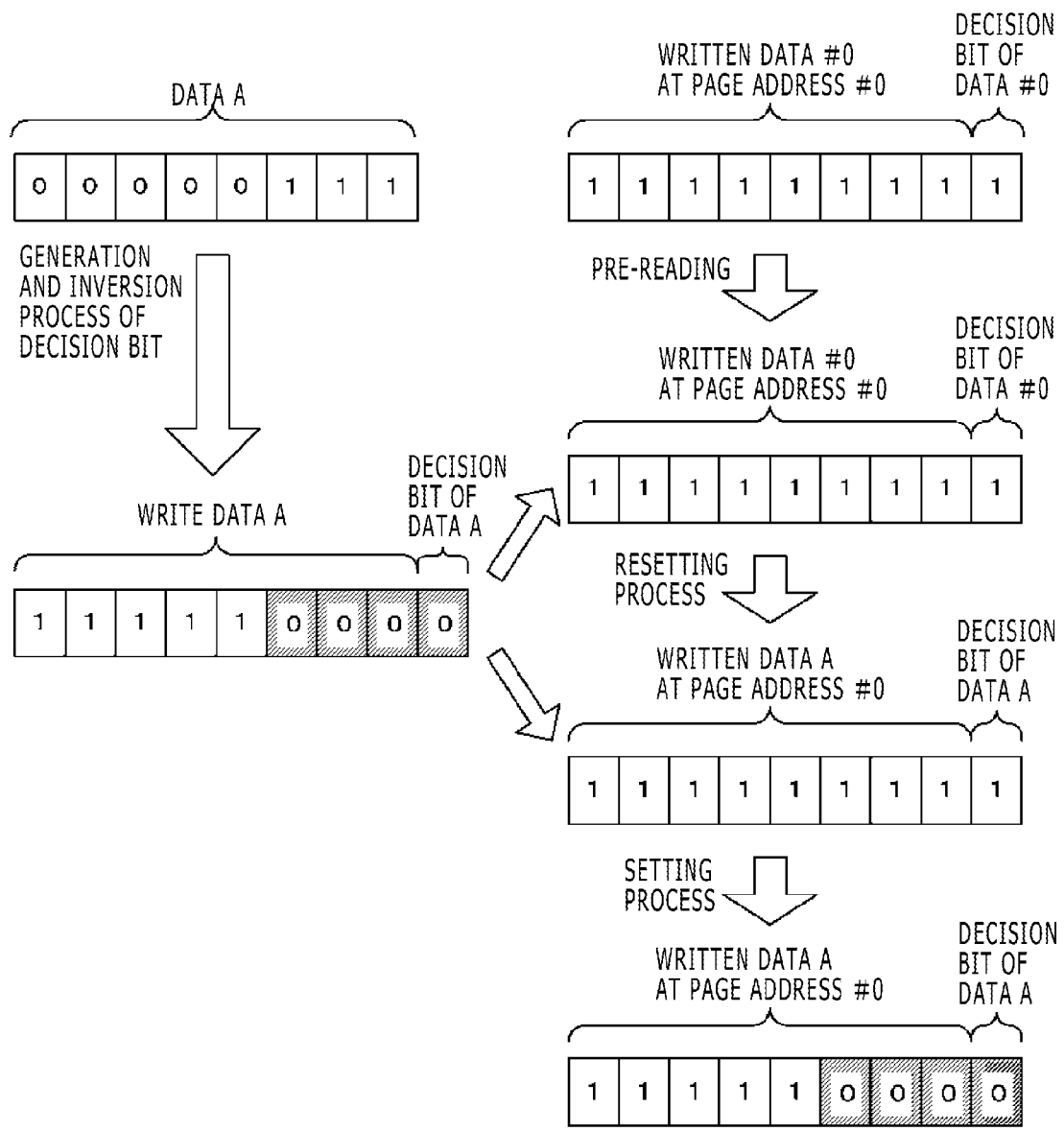
FIG. 17 is a view illustrating a particular example wherein data is inverted and written in the first embodiment.

FIG. 17 illustrates a particular example wherein data is inverted and written in the first embodiment. A case in which data A of "0b00000111" is inputted to the memory system is studied. In this instance, the memory controlling section 100 counts the number of bits of the value of "0" in the data A of 8 bits. In the present example, the bit number "5" of "0" is greater than one half of the total bit number of the data A, namely, greater than "4." Therefore, the memory controlling section 100 generates a decision bit of the value of "0" indicative of the fact that the bit of "0" is the major bit. Then, the memory controlling section 100 inverts the data A and transfers the resulting data "0b11111000" as write data A to the NVRAM 200.

It is assumed that, in the NVRAM 200, "0b111111111" is written in a page address of the writing destination of the write data A and "1" is written in the writing destination of the decision bit of the write data A.

Thus, the NVRAM 200 compares the write data and the decision bit with the written data and decision bit and executes a resetting process. In the present example, the resetting process does not rewrite any bit.

Then, the NVRAM 200 compares the write data and the decision bit with the written data and decision bit and executes a setting process. By this setting process, the written data is rewritten into "0b11111000" and the decision bit is rewritten into "0."

Here, if the writing process is carried out otherwise without inverting the data A, and the bit number of "0" is greater than one half of the total bit number of the data A, then in the setting process or the resetting process, rewriting of a greater number of bits than one half of the data A may possibly be carried out. For example, when the data A is not inverted, the NVRAM 200 is desired to rewrite 5 bits greater than the one half number, namely, "4," in the resetting process. However, since the memory controlling section 100 inverts the data whose major bit is the bit of "0," in each of the setting process or the resetting process, the number of bits to be rewritten in data of n bits is suppressed to n/2 or less as exemplified in FIG. 17. Therefore, the maximum value of the power consumption in each of the setting process and the resetting process is reduced from that where the data is not inverted.

Figure 18:
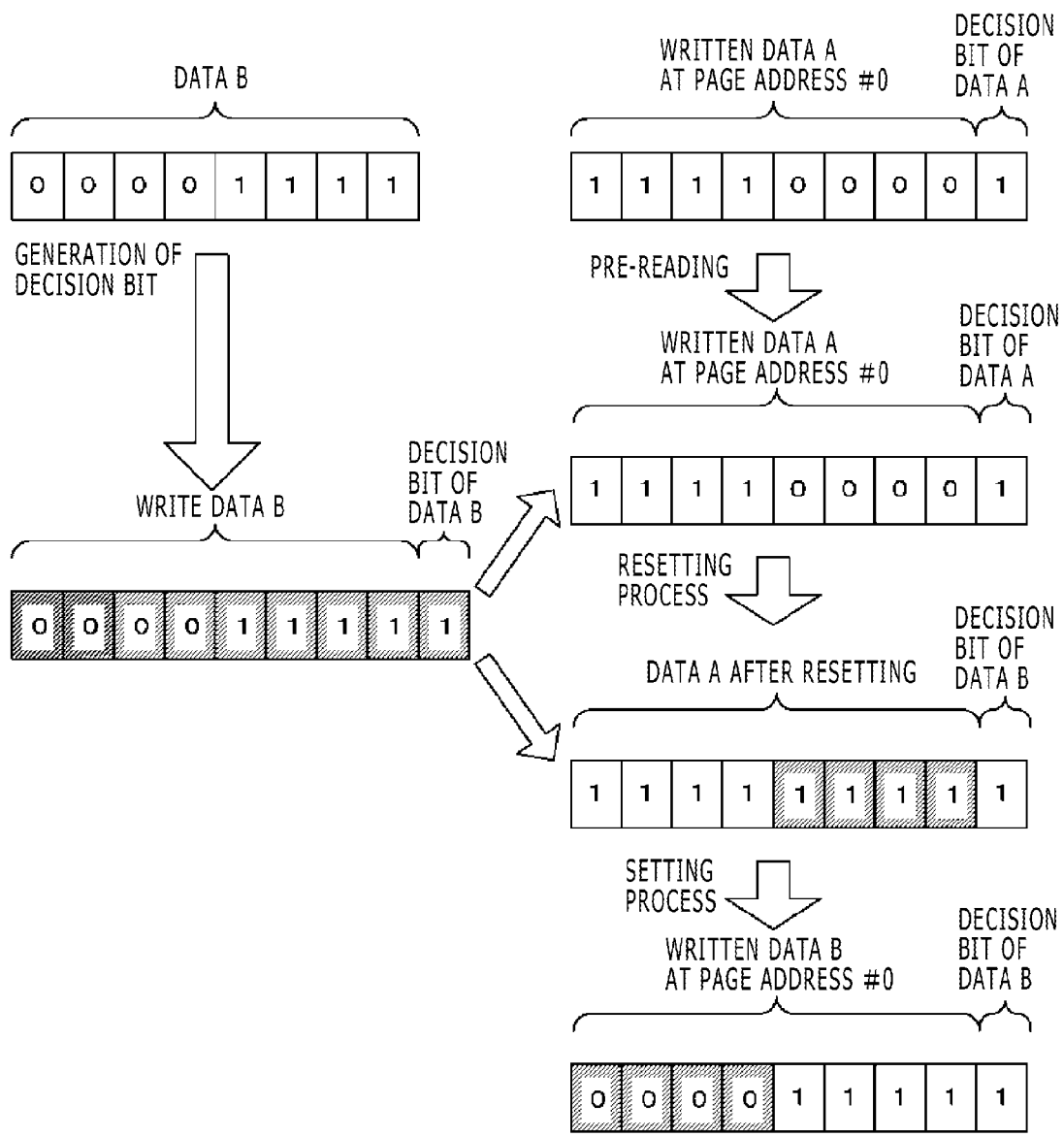
FIG. 18 is a view illustrating a particular example of a writing process wherein a changing bit number is in the maximum in the first embodiment.

FIG. 18 illustrates a particular example of the writing process in which the changing bit number is in the maximum in the first embodiment. The changing bit number in the writing process is in the maximum when all of n bits are rewritten in the setting process or the resetting process. As an example of the case just described, a case in which data B of "0b00001111" is inputted to the memory system is studied. In this example, the bit number "4" of "0" is equal to or smaller than one half of the total bit number of the data B, namely, equal to or smaller than "4." Therefore, the memory controlling section 100 generates a decision bit of the value of "1" representing that the bit of "0" is not the major bit. Then, the memory controlling section 100 transfers the data B without inverting the same as write data B to the NVRAM 200.

It is assumed that, in the NVRAM 200, written data of "0b11110000" is written at a page address of the write data B and "1" is written in the writing destination of the decision bit of the write data B. In this instance, sine all of the corresponding bits between the written data and the write data B have different values, all of the 8 bits of the written data are rewritten.

The NVRAM 200 compares the write data and the decision bit with the written data and decision bit and executes a resetting process. By this resetting process, the 4 bits from the fifth bit to the eighth bit are rewritten so that the written data is updated to "0b11111111." It is to be noted that the decision bit is not rewritten.

Then, the NVRAM 200 compares the write data and the decision bit with the written data and decision bit after the resetting process and executes a setting process. By this setting process, the four bits from the first to the fourth bits are rewritten so that the written data is updated to "0b00001111." It is to be noted that the decision bit is not rewritten.

Since data is inverted when the bit of "0" is the major bit as described above, the bit number of "0" in the write data always becomes equal to or smaller than one half of the total bit number n. Therefore, even in the case where the total changing bit number in the setting process and the resetting process is greater than n/2, in each of the setting process and the resetting process, the changing bit number becomes equal to or smaller than n/2, namely, equal to or smaller than 4 as exemplified in FIG. 18. Accordingly, the maximum value of the power consumption in the writing process decreases. In contrast, if data whose major bit is "0" is not inverted otherwise, then the changing bit number in each of the setting process and the resetting process does not sometimes become equal to or smaller than n/2. For example, since write data of "0b00000000" is not inverted, when this data is to be written into an address in which "0b11111111" is stored, the changing bit number in the resetting process is equal to the total bit number, namely, to "8." However, if the memory controlling section 100 inverts data so that the bit number of a specific value, for example, "0," of write data becomes equal to or smaller than n/2 as occasion demands, then the changing bit number in each of the setting process and the resetting process is suppressed to n/2 or less. As a result, the maximum value of the power consumption decreased from that in an alternative case wherein the data is not inverted.

Figure 19:
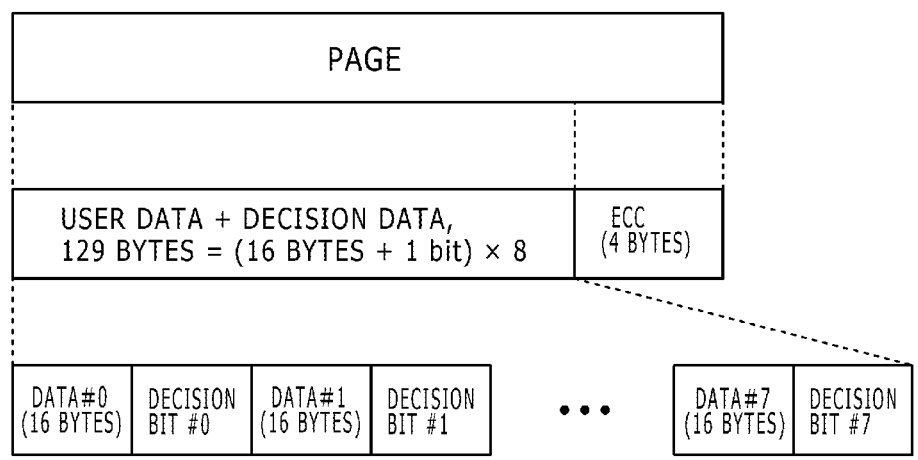
FIG. 19 is a view illustrating an example of a data structure of a page according to a modification to the first embodiment.

It is to be noted that, although the memory system adds a plurality of decision bits collectively to user data as exemplified in FIG. 3, it may otherwise add the decision bits in a distributed fashion to data as exemplified in FIG. 19.

Further, while the information processing system is configured such that the major bit decision portion 121 and the write side inversion portion 123 are provided in the memory controlling section 100 as exemplified in FIG. 4, the configuration of the information processing system is not limited to this. The information processing system may be configured otherwise such that both or one of the major bit decision portion 121 and the write side inversion portion 123 is provided in the host computer 300 or the NVRAM 200. Further, while the information processing system is configured such that the read side inversion portion 131 is provided in the memory controlling section 100 as exemplified in FIG. 5, it may otherwise be configured such that the read side inversion portion 131 is provided in the host computer 300 or the NVRAM 200.

Further, the major bit decision portion 121 counts the number of bits of a specific value irrespective of data retaining characteristics of "0" and "1" and decides whether or not the count value exceeds n/2. However, if the data retaining characteristics of "0" and "1" are different from each other, then the major bit decision portion 121 may otherwise count the number of bits of that value with regard to which the data retaining characteristic is lower. The data retaining characteristic is generally represented by a period of time in which data can be retained continuously in a fixed temperature condition. For example, if it is guaranteed that a certain nonvolatile memory can retain data over 10 years at 70° C. or less, the data retaining characteristic of the nonvolatile memory is represented as 10 years at 70° C. or less. Then, as the time period for the guarantee increases and as the guaranteed temperature increases, it is evaluated that the data retaining characteristic becomes higher. In particular, a data retaining characteristic of "0" and a data retaining characteristic of "1" of the NVRAM 200 are measured in advance by an acceleration test or the like, and the bit of a specific value to be measured by the major bit decision portion 121 may be set to the bit of the value with regard to which the data retaining characteristic is lower, for example, to the bit of "0." If the bit number of the specific value in data of n bits exceeds n/2, then the write side inversion portion 123 inverts the data. Therefore, the number of bits of the value with regard to which the data retaining characteristic is lower is suppressed to a number equal to or less than the number of bits of the value with regard to which the data retaining characteristic is higher. As a result, the data retaining characteristic of the NVRAM 200 is improved.

In this manner, with the first embodiment of the present technology, since the memory controlling section 100 inverts data in which bits of a specific value are the major bit, the changing bit number in the setting process or the resetting process can be suppressed to a number equal to or less than one half of the total bit number. Consequently, the maximum power consumption in each of the setting process and the resetting process is reduced from that in an alternative case in which the data is not inverted. By the reduction of the maximum power consumption, the scale of the power supply circuit can be reduced and the NVRAM 200 can be minimized. Further, since the memory controlling section 100 need not read out written data and compare the written data with data to be written, a drop of the speed of the writing process is suppressed. Accordingly, the memory system can reduce the maximum power consumption while suppressing a drop of the speed in the writing process.

2. Second Embodiment

Example of the Configuration of the Memory Controlling Section

Figure 20:
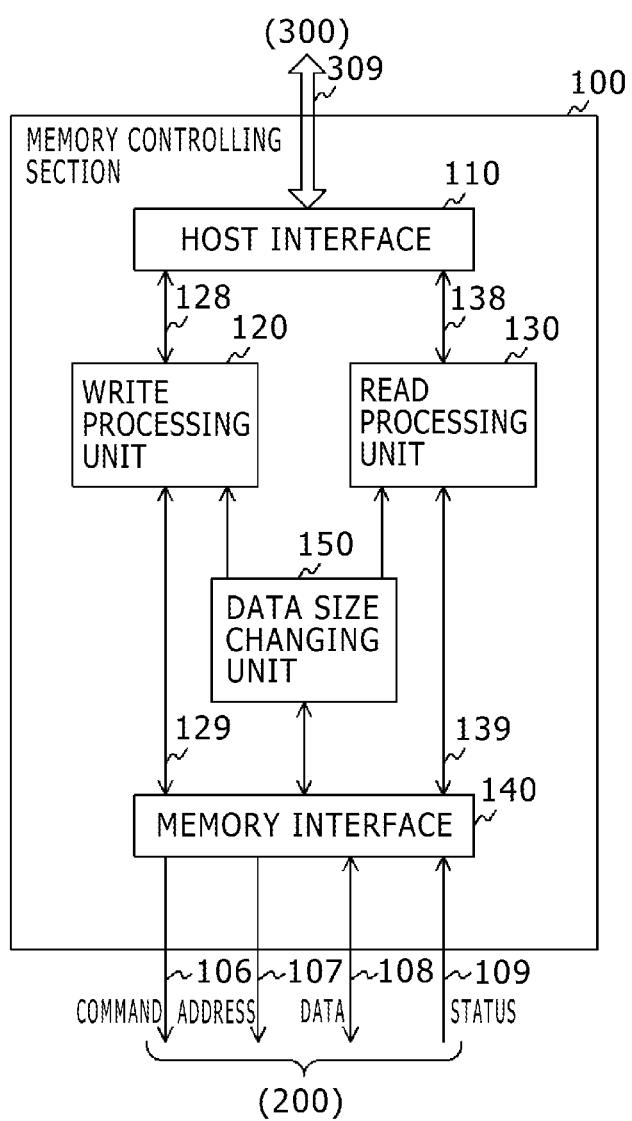
FIG. 20 is a block diagram showing an example of a configuration of a memory controlling section according to a second embodiment.

FIG. 20 is a block diagram showing an example of a configuration of a memory controlling section 100 according to a second embodiment. The memory controlling section 100 in the second embodiment is similar to the memory controlling section 100 in the first embodiment except that it can change the data size in response to the specifications of the NVRAM 200. In particular, referring to FIG. 20, the memory controlling section 100 in the second embodiment additionally includes a data size changing unit 150.

The data size changing unit 150 changes the data size, namely, the bit number n of n bits, of data of a decision target. The data size changing unit 150 issues, before writing of data is started, a data size acquisition command for acquiring the data size and transfers the data size acquisition command to the NVRAM 200 through the memory interface 140. The NVRAM 200 notifies the memory controlling section 100 of a page size and a data size of each of data in a page in accordance with the data size acquisition command. The data size changing unit 150 changes the setting of the page size and the data size in the write processing unit 120 and the read processing unit 130 based on the received size.

Figure 21:
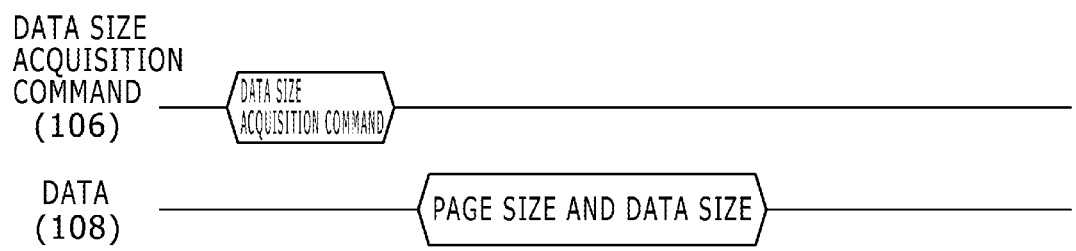
FIG. 21 is a timing chart illustrating an example of data transferred upon data size acquisition in the second embodiment.

FIG. 21 illustrates an example of data transferred upon the data size acquisition in the second embodiment. The memory controlling section 100 issues and transfers a data size acquisition command to the NVRAM 200 through the signal line 106. The NVRAM 200 transfers a page size and a data size to the memory controlling section 100 through the signal line 108 in accordance with the data size acquisition command.

In this manner, with the present second embodiment, the memory controlling section 100 can change the data size in response to a size received from the NVRAM 200. Consequently, the memory controlling section 100 can be ready for a plurality of kinds of NVRAMs 200 having different access units from each other.

3. Third Embodiment

Example of the Configuration of the Memory Controlling Section

Figure 22:
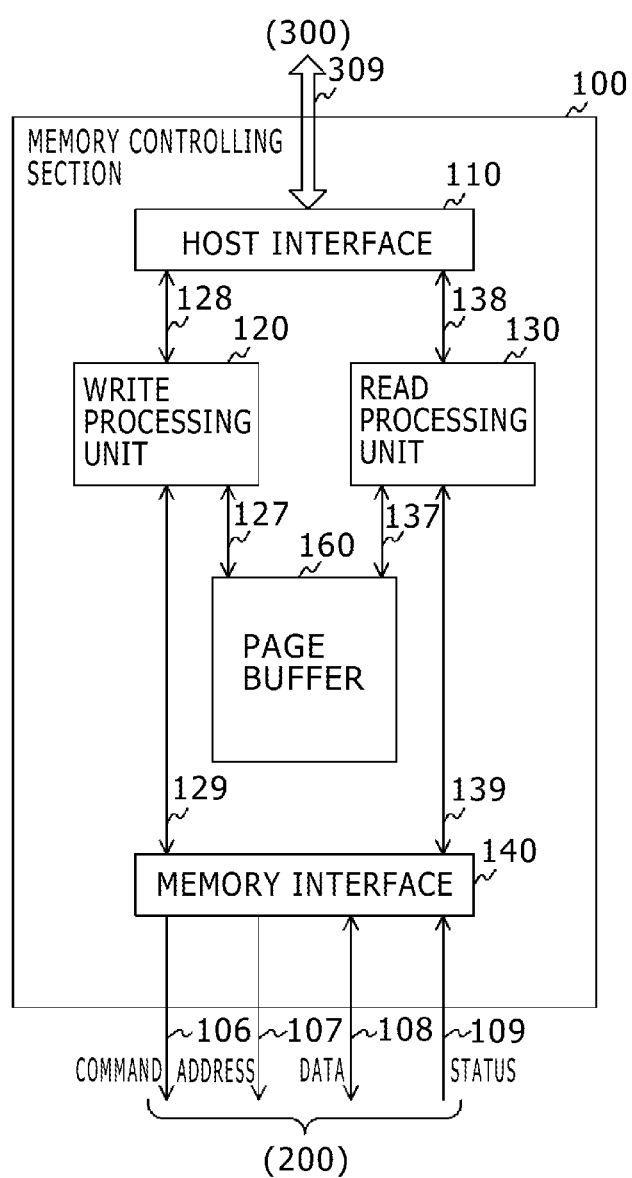
FIG. 22 is a block diagram showing an example of a configuration of a memory controlling section according to a third embodiment.

FIG. 22 is a block diagram showing an example of a configuration of a memory controlling section 100 according to a third embodiment. The memory controlling section 100 of the third embodiment is similar to the first embodiment except that it includes a page buffer of a changed configuration. In particular, referring to FIG. 22, the memory controlling section 100 is different from that in the first embodiment in that it further includes a page buffer 160 shared by the write processing unit 120 and the read processing unit 130.

The page buffer 160 retains read data and decision bits of the read data. When data written at a certain page address is to be copied to a different page address, the host computer 300 transfers a command for the instruction of copying to the memory controlling section 100. The read processing unit 130 receives data and a decision bit at a page address of a copying source indicated by the command from the NVRAM 200 and inverts the data as occasion demands. The read processing unit 130 retains the data before or after the inversion as read data into the page buffer 160 together with the decision bit. The write processing unit 120 reads out the read data and the decision bit from the page buffer 160 and inverts the data as occasion demands. The write processing unit 120 transfers the read data before or after the inversion as write data to the NVRAM 200 together with the decision bit. The write data and the decision bit are written into the page address of the copying destination of the NVRAM 200.

Example of the Configuration of the Write Processing Unit

Figure 23:
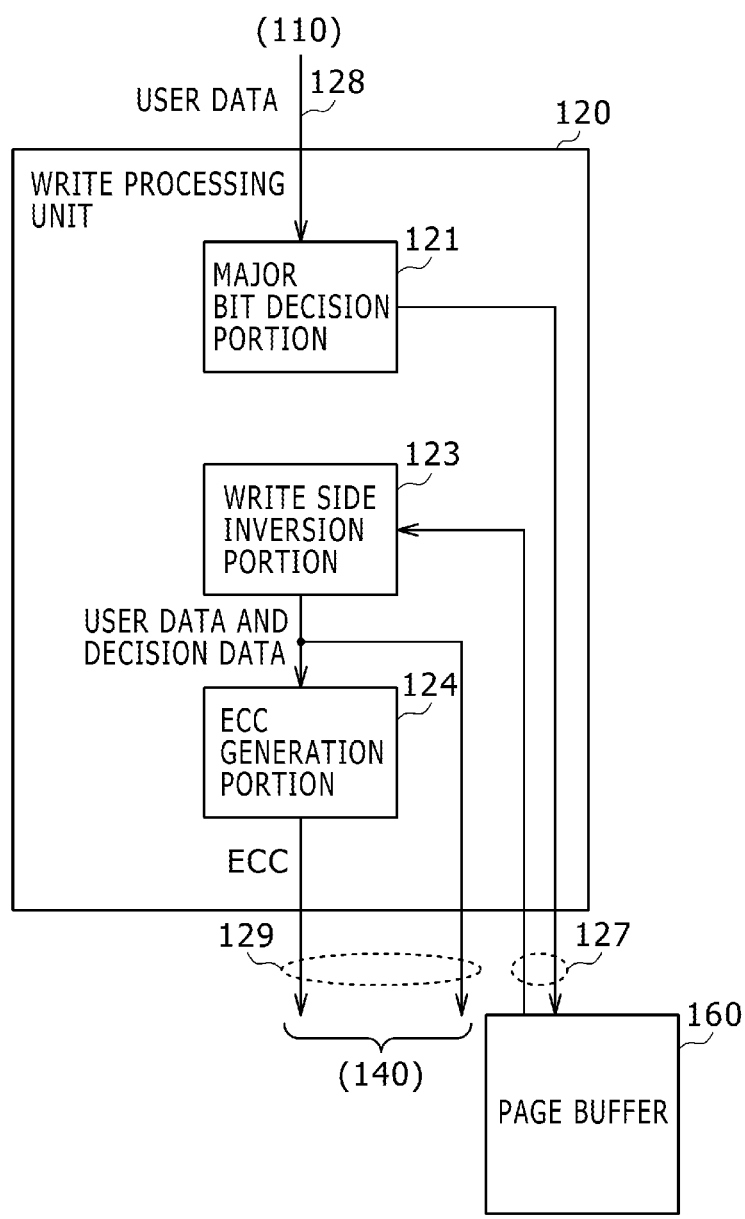
FIG. 23 is a block diagram showing an example of a configuration of a write processing unit shown in FIG. 22.

FIG. 23 is a block diagram showing an example of a configuration of the write processing unit 120 in the third embodiment. The write processing unit 120 in the third embodiment is similar to that in the first embodiment except that it does not include the page buffer 122. The major bit decision portion 121 of the write processing unit 120 retains user data and decision data into the page buffer 160 in place of the page buffer 122. The write side inversion portion 123 reads out the user data and the decision data retained in the page buffer 160 and inverts the data based on the decision data as occasion demands.

Example of the Configuration of the Read Processing Unit

Figure 24:
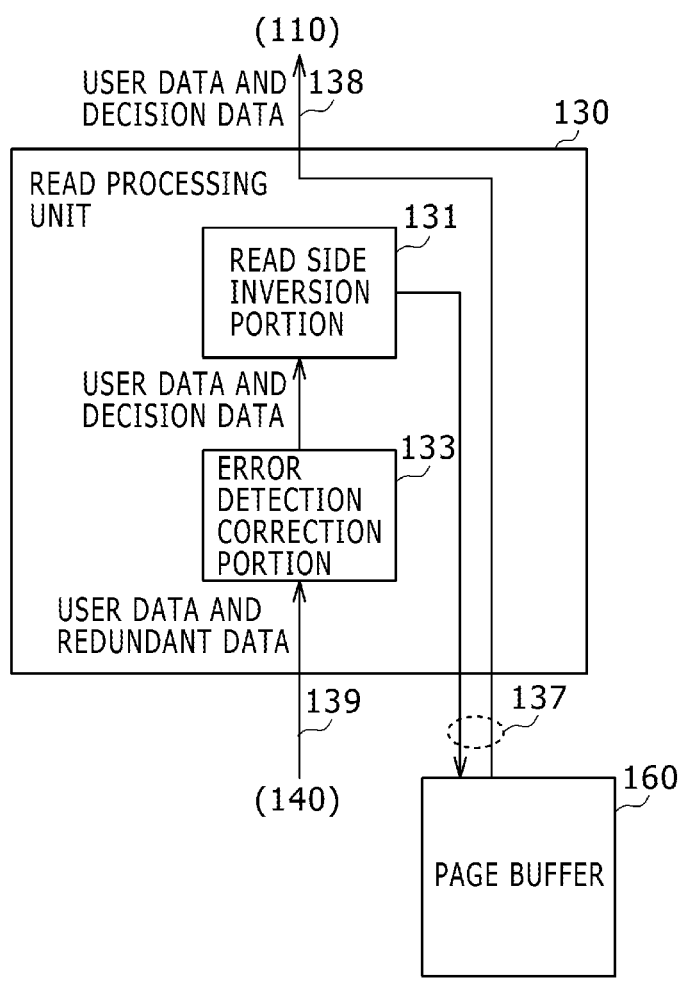
FIG. 24 is a block diagram showing an example of a configuration of a read processing unit shown in FIG. 22.

FIG. 24 is a block diagram showing an example of a configuration of the read processing unit 130 in the third embodiment. The read processing unit 130 in the third embodiment is similar to that in the first embodiment except that it does not include the page buffer 132. The error detection correction portion 133 of the read processing unit 130 supplies user data and decision data to the read side inversion portion 131 without the intervention of the page buffer 132. The read side inversion portion 131 retains the user data including the read data and the decision data into the page buffer 160.

In this manner, with the third embodiment, the memory controlling section 100 can retain read data and decision data into the page buffer 160 and then transfer the read data as write data to the NVRAM 200 after it inverts the read data as occasion demands. Since there is no necessity to retain read data into an external buffer of the memory system including the memory controlling section 100 and the NVRAM 200, the memory system can copy data at a high speed between different page addresses.

4. Fourth Embodiment

Example of the Configuration of the Memory Controlling Section

Figure 25:
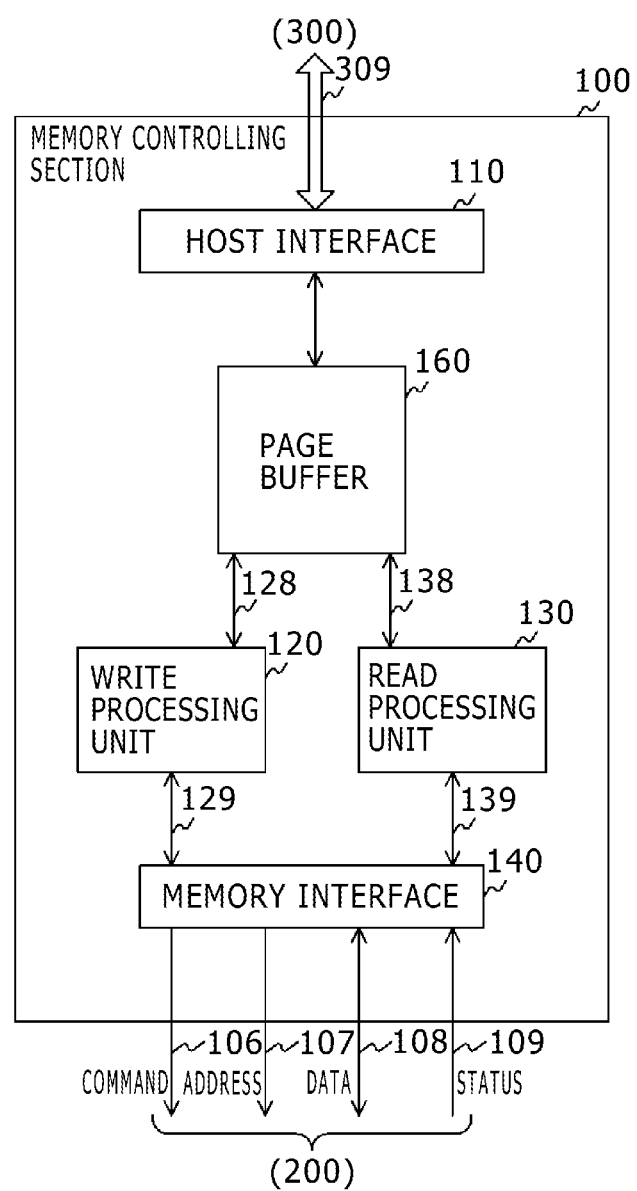
FIG. 25 is a block diagram showing an example of a configuration of a memory controlling section according to a fourth embodiment.

FIG. 25 is a block diagram showing an example of a configuration of a memory controlling section 100 according to a fourth embodiment. The memory controlling section 100 in the fourth embodiment is similar to that in the third embodiment except that the disposition of the page buffer 160 is changed. More particularly, the memory controlling section 100 in the fourth embodiment is different from that in the third embodiment in that the page buffer 160 is disposed between the host interface 110 and the write processing unit 120 and read processing unit 130. The host interface 110 transfers a command, an address, data, a status and so forth to and from the write processing unit 120 and the read processing unit 130 through the page buffer 160.

The page buffer 160 in the fourth embodiment retains read data but does not retain decision data. The read processing unit 130 retains read data into the page buffer 160. The write processing unit 120 changes the value of read data retained in the page buffer 160 as occasion demands. Then, the write processing unit 120 reads out read data from the page buffer 160 and counts the number of bits of a specific value in the read data. If the count value is greater than n/2, then the write processing unit 120 inverts the read data and supplies the inverted read data as write data to the NVRAM 200 together with the decision data.

Example of the Configuration of the Write Processing Unit

Figure 26:
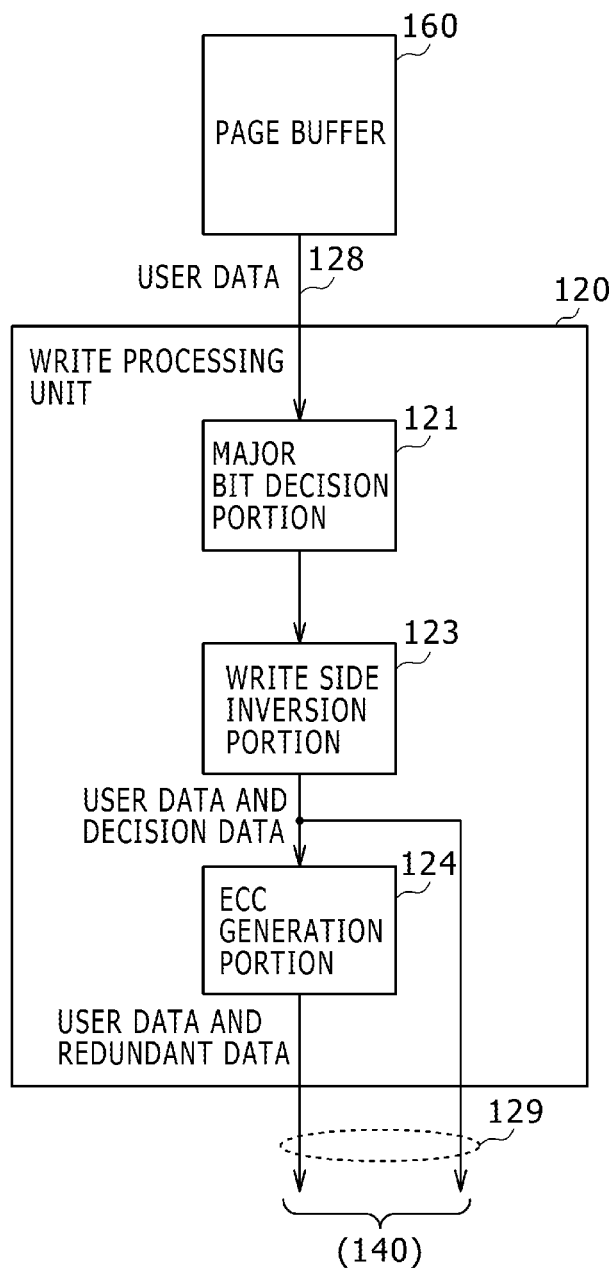
FIG. 26 is a block diagram showing an example of a configuration of a write processing unit shown in FIG. 25.

FIG. 26 is a block diagram showing an example of a configuration of the write processing unit 120 in the fourth embodiment. Referring to FIG. 26, the major bit decision portion 121 in the fourth embodiment receives user data transferred from the host interface 110 or the read processing unit 130 through the page buffer 160. The major bit decision portion 121 generates decision data regarding the user data and supplies the user data and the decision data to the write side inversion portion 123.

Example of the Configuration of the Read Processing Unit

Figure 27:
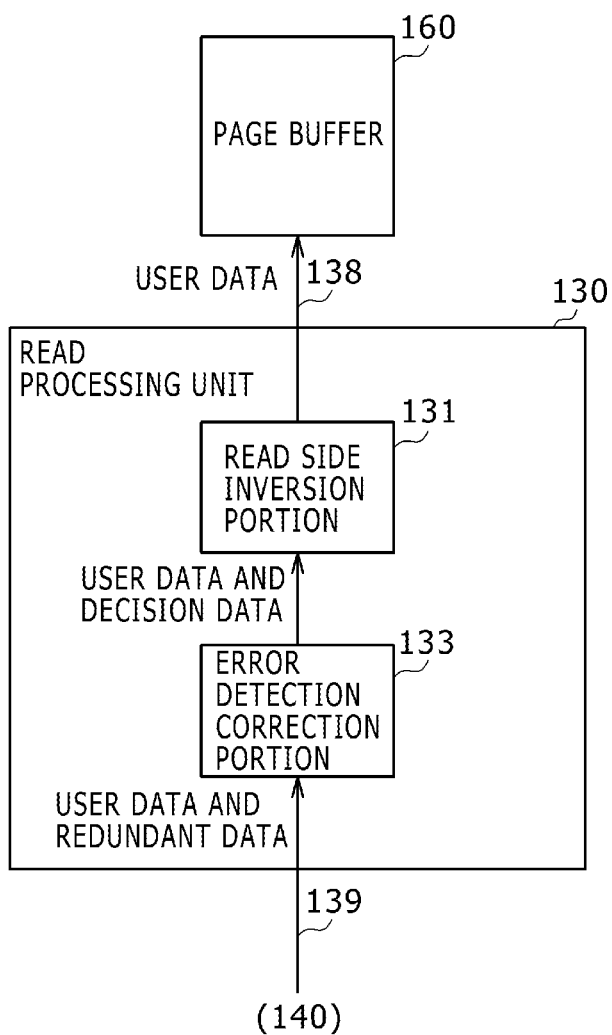
FIG. 27 is a block diagram showing an example of a configuration of a read processing unit shown in FIG. 25.

FIG. 27 is a block diagram showing an example of a configuration of the read processing unit 130 in the fourth embodiment. The read processing unit 130 in the fourth embodiment is similar to that in the third embodiment except that decision data is not retained by the page buffer 160 but only user data is retained into the page buffer 160.

In this manner, with the fourth embodiment, the memory controlling section 100 can retain read data into the page buffer 160 and transfer the read data as write data to the NVRAM 200 after it inverts the read data as occasion demands. Since there is no necessity to retain read data into an external buffer of the memory system, the memory system can copy data at a high speed between different page addresses. Further, since the memory controlling section 100 counts the number of bits of a specific value in read data read out from the page buffer 160, the memory system can copy the read data retained in the page buffer 160 with the value of the read data changed.

5. Fifth Embodiment

Example of the configuration of the Memory Controlling Section

In the first embodiment described hereinabove, a process of inverting all bits of data of n bits is executed to reduce the number of bits of a specific value in the data to n/2 or less. However, a process other than the process of inverting all bits may be carried out if it can reduce the number of bits of a specific value in data of n bits to n/2 or less. For example, the memory controlling section 100 may carry out a process of inverting part of bits in place of the process of inverting all bits of data. A memory controlling section 100 according to a fifth embodiment is similar to that in the first embodiment except that it executes a process of inverting part of bits to reduce the number of bits of a specific value in data of n bits to n/2 or less.

Figure 28:
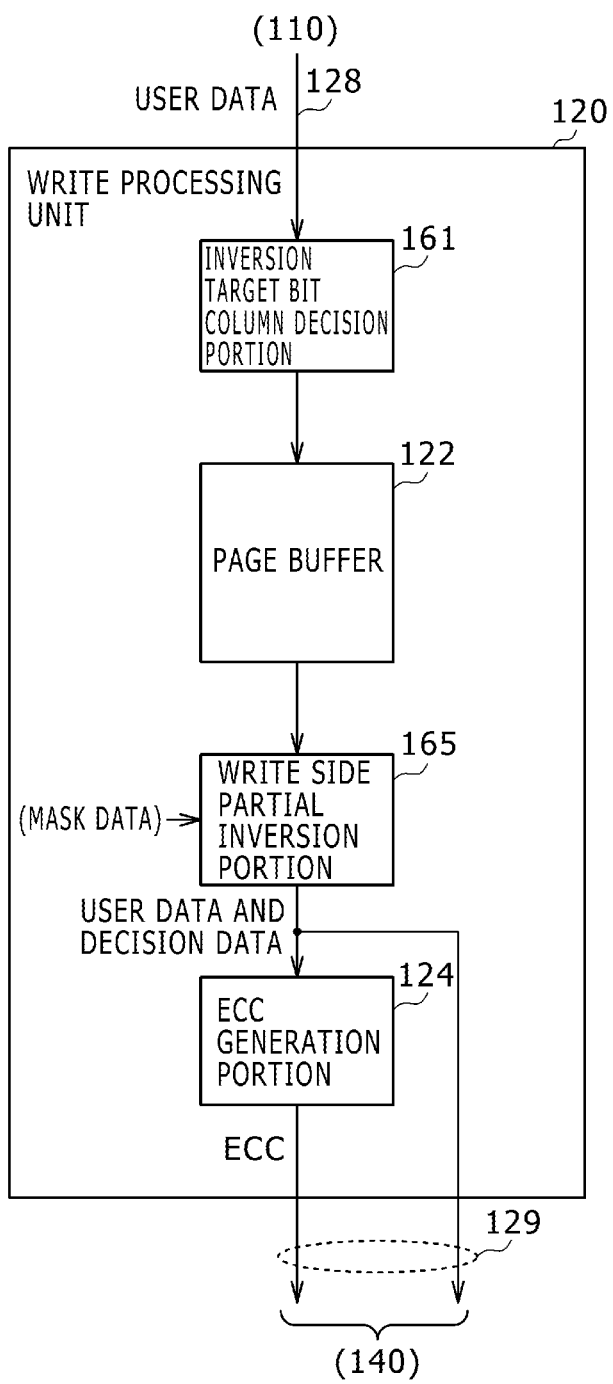
FIG. 28 is a block diagram showing an example of a configuration of a write processing unit in a fifth embodiment.

FIG. 28 is a block diagram showing an example of a configuration of the write processing unit 120 in the fifth embodiment. The write processing unit 120 in the fifth embodiment is similar to that in the first embodiment except that it includes an inversion target bit column decision portion 161 and a write side partial inversion portion 165 in place of the major bit decision portion 121 and the write side inversion portion 123.

The inversion target bit column decision portion 161 decides whether or not the number of bits of a specific value in an odd-numbered bit column of data is greater than the number of bits of the specific value in an even-numbered bit column of the data. More particularly, every time data of n bits is inputted, the inversion target bit column decision portion 161 counts the number of bits of a specific value such as, for example, "0" in odd-numbered bit columns and even-numbered bit columns of the data. Then, the inversion target bit column decision portion 161 decides whether or not the count value from the odd-numbered bit columns is greater than the count value from the even-numbered bit columns.

The inversion target bit column decision portion 161 generates a decision bit representative of a result of the decision and retains the data and the decision bit into the page buffer 122. For example, when the count value of "0" in the odd-numbered bit columns is greater than the count value of "0" in the even-numbered bit columns, then a decision bit of "1" is generated. On the other hand, if the count value in the odd-numbered bit columns is equal to or smaller than the count value of the even-numbered bit columns, then a decision bit of "0" is generated. It is to be noted that the inversion target bit column decision portion 161 is an example of a decision portion.

The write side partial inversion portion 165 inverts the odd-numbered bit columns or the even-numbered bit columns of the data retained in the page buffer 122 based on the decision bit of the data. In particular, the write side partial inversion portion 165 first reads out data and a decision bit of the data from the page buffer 122. If the decision bit indicates that the count value in the odd-numbered bit columns is higher, then the write side partial inversion portion 165 inverts the odd-numbered bit columns to generate write data, but inverts, in any other case, the even-numbered bit columns to generate write data.

In the inversion of the even-numbered bit columns, the write side partial inversion portion 165 determines, for example, an exclusive OR between mask data of n bits wherein the even-numbered bit columns indicate "1" and the odd-numbered bit columns indicate "0" and data of n bits of the inversion target in a unit of a bit to invert the even-numbered bit columns. On the other hand, in the inversion of the odd-numbered bit columns, the write side partial inversion portion 165 determines, for example, an exclusive OR between mask data of n bits wherein the odd-numbered bit columns indicate "1" and the even-numbered bit columns indicate "0" and data of n bits of the inversion target for each bit to invert the odd-numbered bit columns.

By inverting those of the odd-numbered bit columns and the even-numbered bit columns which indicate a higher count value of the value of "0," the number of "0s" in the data after the inversion is always equal to or smaller than one half of the total bit number of the data.

The write side partial inversion portion 165 supplies user data configured from a plurality of write data and decision data configured from a plurality of decision bits to the ECC generation portion 124 and the memory interface 140. It is to be noted that the write side partial inversion portion 165 is an example of a write side outputting portion.

Figure 29:
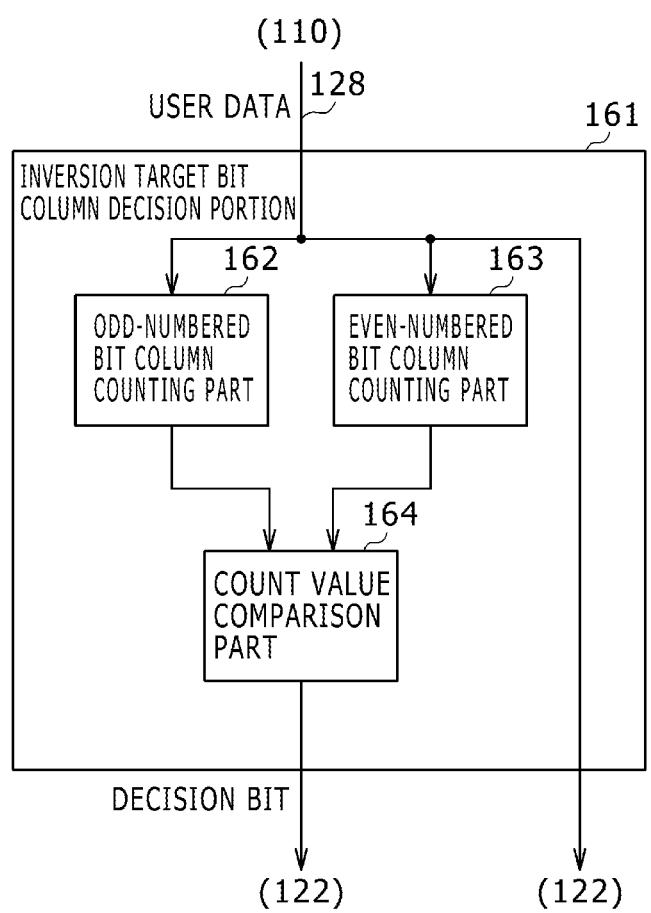
FIG. 29 is a block diagram showing an example of a configuration of an inversion target bit column decision portion in the fifth embodiment.

Example of the Configuration of the Inversion Target Bit Column Decision Portion FIG. 29 is a block diagram showing an example of a configuration of the inversion target bit column decision portion 161 in the fifth embodiment. Referring to FIG. 29, the inversion target bit column decision portion 161 shown includes an odd-numbered bit column counting part 162, an even-numbered bit column counting part 163 and a count value comparison part 164.

The odd-numbered bit column counting part 162 counts the number of the value of "0" in the odd-numbered bit columns of data of n bits. The odd-numbered bit column counting part 162 supplies a count value thereof to the count value comparison part 164. The even-numbered bit column counting part 163 counts the number of the value of "0" in the even-numbered bit columns of data of n bits. The even-numbered bit column counting part 163 supplies a count value thereof to the count value comparison part 164.

The count value comparison part 164 compares the count value in the odd-numbered bit columns and the count value in the even-numbered bit columns with each other. The count value comparison part 164 generates a bit representative of a result of the comparison as a decision bit. For example, if the count value in the odd-numbered bit columns is higher than the count value in the even-numbered bit columns, then a decision bit of "1" is generated. On the other hand, if the count value in the odd-numbered bit columns is equal to or lower than the count value in the even-numbered bit columns, then a decision bit of "0" is generated. The count value comparison part 164 retains the decision bit into the page buffer 122.

By providing the odd-numbered bit column counting part 162 and the even-numbered bit column counting part 163 as exemplified in FIG. 29, a process of counting the number of the value of "0" in the odd-numbered bit columns and a process of counting the number of the value of "0" in the even-numbered bit columns can be executed in parallel to each other. Consequently, the process of generating a decision bit can be carried out at a higher speed than that in the first embodiment wherein the processes of counting the number of "0s" are not executed in parallel to each other.

FIGS. 30A and 30B illustrate an example of data and decision bits in the fifth embodiment. FIG. 30A illustrates an example of odd-numbered bit columns and even-numbered bit columns in data. For example, a bit at an odd-numbered position as counted from the right in the bit columns is an odd-numbered bit, and a bit at an even-numbered position is an even-numbered bit.

FIG. 30B illustrates an example of data and a decision bit. If data N of a value of 0 to 15 in a hexadecimal representation is represented in a binary representation, then bit columns "0b0000" to "0b1111" are obtained. The number of "0s" in the odd-numbered bit columns and the even-numbered bit columns in the data N is counted by the inversion target bit column decision portion 161. For example, both of the numbers of "0s" in the odd-numbered bit columns and the even-numbered bit columns in "0b0000" are 2. Meanwhile, the number of "0s" in the odd-numbered bit columns in "0010" is 2 and the number of "0s" in the even-numbered bit columns is 1.

Then, if the count value in the odd-numbered bit columns is higher than the count value in the even-numbered bit columns, then the inversion target bit column decision portion 161 generates a decision bit of "1." On the other hand, if the count value in the odd-numbered bit columns is equal to or lower than the count value of the even-numbered bit columns, then the inversion target bit column decision portion 161 generates a decision bit of "0." For example, since the count value of the odd-numbered bit columns in "0000" is equal to or lower than the count value of the even-numbered bit columns, a decision bit of "0" is generated. On the other hand, since the count value of the odd-numbered bit columns in "0010" is higher than the count value of the even-numbered bit columns, a decision bit of "1" is generated.

FIG. 31 illustrates an example of data wherein the odd-numbered bit columns or the even-numbered bit columns are inverted in the fifth embodiment. If the decision bit is "0," then the write side partial inversion portion 165 carries out exclusive ORing between "0b1010" which is mask data for even-numbered column inversion and the data N and outputs a result of the processing, namely, data $N_A'$. On the other hand, if the decision bit is "1," then the write side partial inversion portion 165 carries out exclusive ORing between "0b0101" which is mask data for odd-numbered column inversion and the data N and outputs a result of the processing, namely, data $N_B'$. For example, if a decision bit "0" is generated with regard to the data "0b0000," then data $N_A'$ of "0b1010" is outputted as a result of use of the mask data "0b1010" for even-numbered column inversion. On the other hand, if a decision bit "1" is generated with regard to the data "0b0010," then data $N_B'$ of "0b0111" is outputted as a result of use of the mask data "0b0101" for odd-numbered column inversion.

The data $N_A'$ and the data $N_B'$ are data in which those of the even-numbered bit columns and the odd-numbered bit columns in the data N which include a greater number of "0s" are inverted. Therefore, the number of "0s" is always reduced to one half or less of the total bit number of the data. By executing the process of inverting the even-numbered bit columns or the odd-numbered bit columns of data in this manner, the number of bits of a specific value in data of n bits can be reduced to n/2 or less.

It is to be noted that the memory controlling section 100 may carry out a process other than the process of inverting the even-numbered bit columns or the odd-numbered bit columns of data if it is a conversion process which can reduce the number of bits of a specific value in the data of n bits to n/2 or less. For example, the memory controlling section 100 may carry out a process of inverting high order bit columns or low order bit columns of data.

Example of the Configuration of the Read Processing Unit

Figure 32:
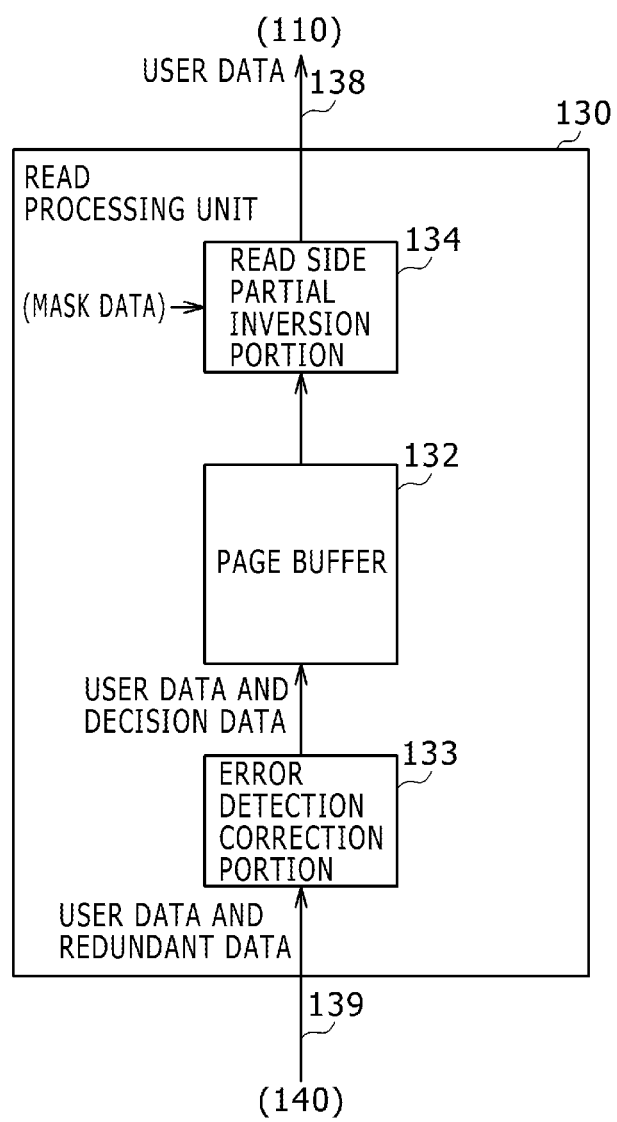
FIG. 32 is a block diagram showing an example of a configuration of a read processing unit in the fifth embodiment.

FIG. 32 is a block diagram showing an example of a configuration of a read processing unit 130 in the fifth embodiment. The read processing unit 130 in the fifth embodiment is similar to that of the first embodiment except that a read side partial inversion portion 134 is provided in place of the read side inversion portion 131.

The read side partial inversion portion 134 inverts even-numbered bit columns or odd-numbered bit columns of data retained in the page buffer 132 based on the decision bit. First, the read side partial inversion portion 134 reads out data and the decision bit of the data from the page buffer 132. Then, if the decision bit indicates that the count value of the odd-numbered bit columns is higher, then the read side partial inversion portion 134 inverts the odd-numbered bit columns to generate read data. However, if the decision bit indicates that the count value of the even-numbered bit columns is higher, then the read side partial inversion portion 134 inverts the even-numbered bit columns to generate read data. The read side partial inversion portion 134 supplies user data including the read data to the host interface 110. It is to be noted that the read side partial inversion portion 134 is an example of a read side outputting portion.

Example of Operation of the Memory Controlling Section

Figure 33:
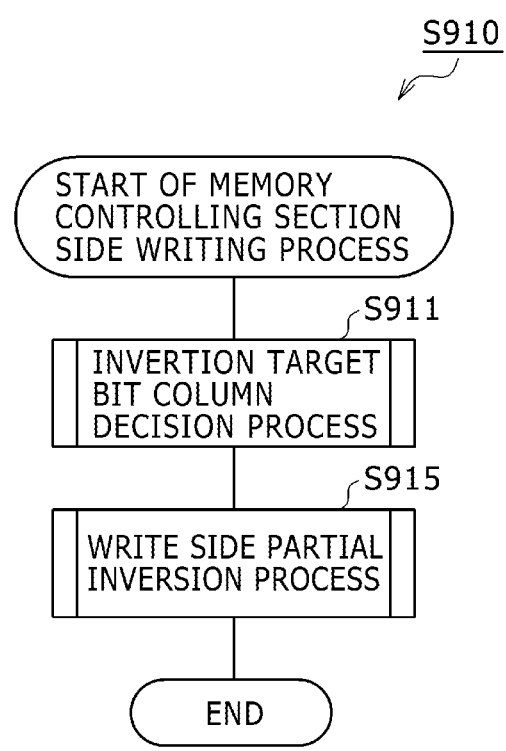
FIG. 33 is a flow chart illustrating an example of a memory controlling section side writing process in the fifth embodiment.

FIG. 33 is a flow chart illustrating an example of a memory controlling section side writing process in the fifth embodiment. The memory controlling section side writing process in the fifth embodiment is similar to that of the first embodiment except that processes at steps S911 and S915 are executed in place of the processes at steps S920 and S930. The memory controlling section 100 executes an inversion target bit column decision process for deciding whether or not the number of "0s" in the odd-numbered bit columns is greater than that in the even-numbered bit columns at step S911. Then, the memory controlling section 100 executes a write side partial inversion process for inverting the odd-numbered bit columns or the even-numbered bit columns at step S915. After the process at step S915, the memory controlling section 100 ends the memory controlling section side writing process.

Figure 34:
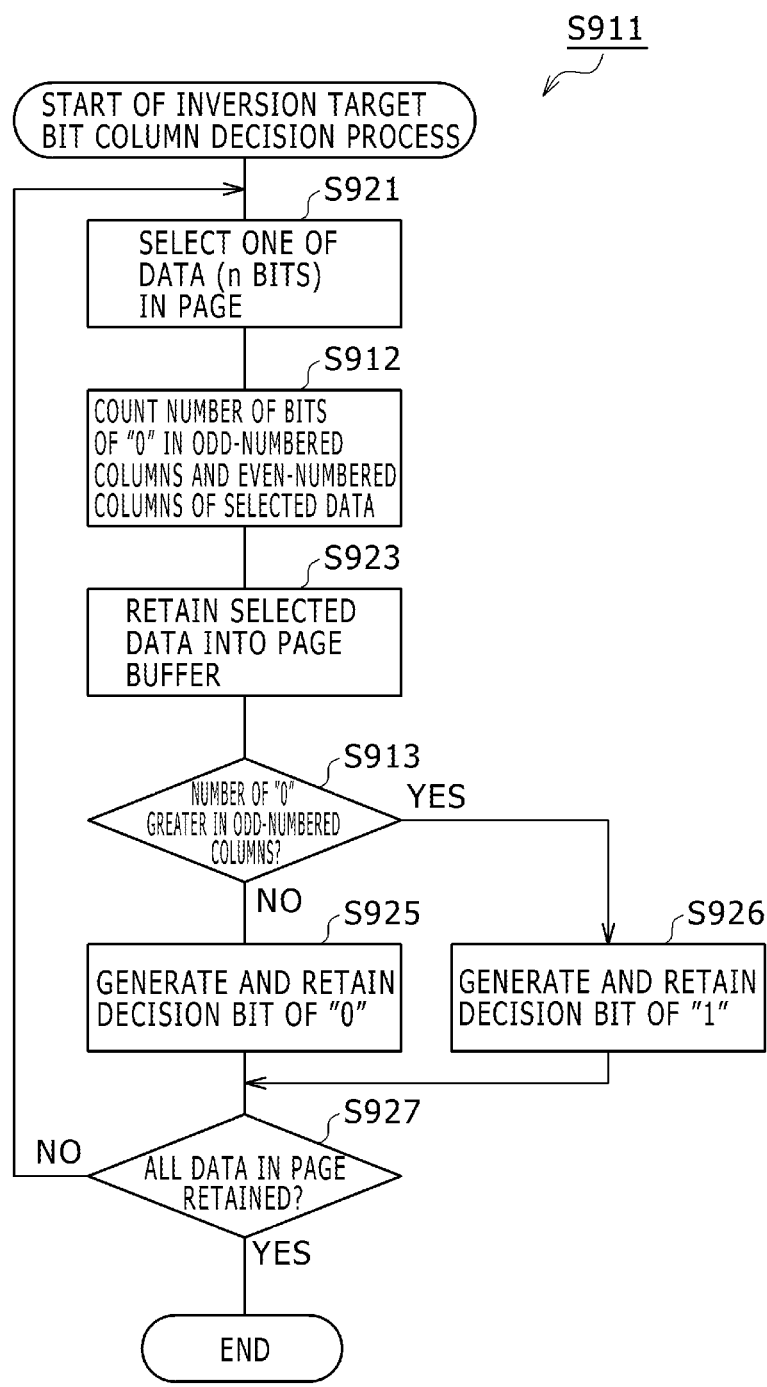
FIG. 34 is a flow chart illustrating an example of an inversion target bit column decision process illustrated in FIG. 33.

FIG. 34 is a flow chart illustrating an example of the inversion target bit column decision process at step S911 of FIG. 33. The inversion target bit column decision process is similar to the major bit decision process of the first embodiment except that processes at steps S912 and S913 are executed in place of the processes at steps S922 and S924.

After the process at step S921, the inversion target bit column decision portion 161 counts the number of bits of "0" in the odd-numbered bit columns and the even-numbered bit columns of the selected data at step S912. The inversion target bit column decision portion 161 retains the selected data into the page buffer 122 at step S923. Then, the inversion target bit column decision portion 161 decides whether or not the number of "0s" in the odd-numbered bit columns is greater at step S913.

If the number of "0s" in the odd-numbered bit columns is equal to or smaller than the number of "0s" in the even-numbered bit columns at step S913 and the decision at step S913 is No, the inversion target bit column decision portion 161 generates a decision bit of the value of "0" and retains the generated decision bit into the page buffer 122 at step S925. On the other hand, if the number of "0s" in the odd-numbered bit columns is greater than the number of "0s" in the even-numbered bit columns at step S913 and the decision at step S913 is Yes, then the inversion target bit column decision portion 161 generates a decision bit of the value of "1" and retains the generated decision bit into the page buffer 122 at step S926. After the process at step S925 or step S926, the inversion target bit column decision portion 161 executes a process at step S927.

Figure 35:
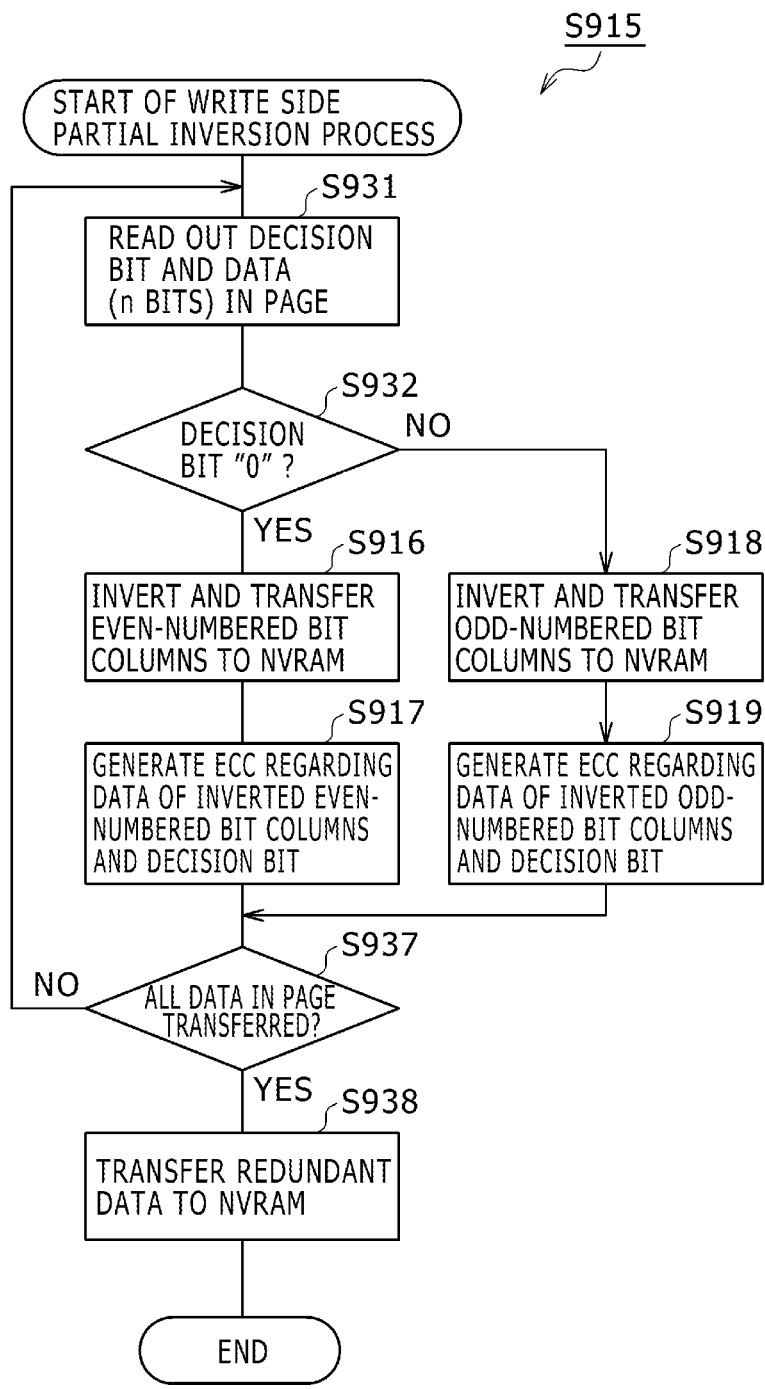
FIG. 35 is a flow chart illustrating an example of a write side partial inversion process illustrated in FIG. 33.

FIG. 35 is a flow chart illustrating an example of the write side partial inversion process at step S915 of FIG. 33. The write side partial inversion process is similar to the write side inversion process of the first embodiment except that processes at steps S916 to S919 are executed in place of the processes at steps S933 to 936.

After the process at step S931, the write side partial inversion portion 165 decides whether or not the decision bit indicates "0" at step S932. If the decision bit is "0" at step S932 and the decision at step S932 is Yes, then the write side partial inversion portion 165 inverts the even-numbered bit columns and transmits the inverted bit columns as write data to the NVRAM 200 at step S916. Then, the write side partial inversion portion 165 generates an error correction code for the data generated by inverting the even-numbered bit columns and the decision bit at step S917.

On the other hand, if the decision bit indicates "1" at step S932 and the decision at step S932 is No, then the write side partial inversion portion 165 inverts the odd-numbered bit columns and transmits the inverted bit columns as write data to the NVRAM 200 (step S918). Then, the write side partial inversion portion 165 generates an error correction code for the data generated by inverting the odd-numbered bit columns and the decision bit at step S919. After the process at step S917 or step S919, the write side partial inversion portion 165 executes the processes at steps S937 and S938.

Figure 36:
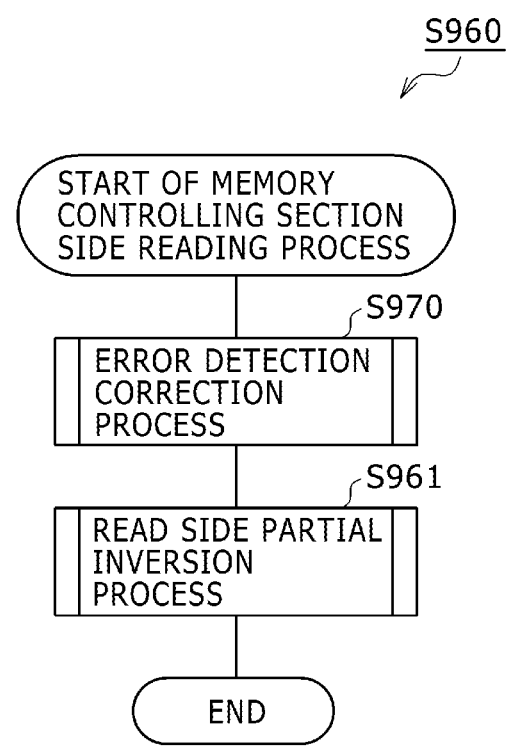
FIG. 36 is a flow chart illustrating an example of a memory controlling section side reading process in the fifth embodiment.

FIG. 36 is a flow chart illustrating an example of a memory controlling section side reading process in the fifth embodiment. The memory controlling section side reading process in the fifth embodiment is similar to that of the first embodiment except that a process at step S961 is executed in place of the process at step S980. After the process at step S970, the memory controlling section 100 executes a read side partial inversion process for inverting the odd-numbered bit columns or the even-numbered bit columns at step S961. After the process at step S961, the memory controlling section 100 ends the memory controlling section side reading process.

Figure 37:
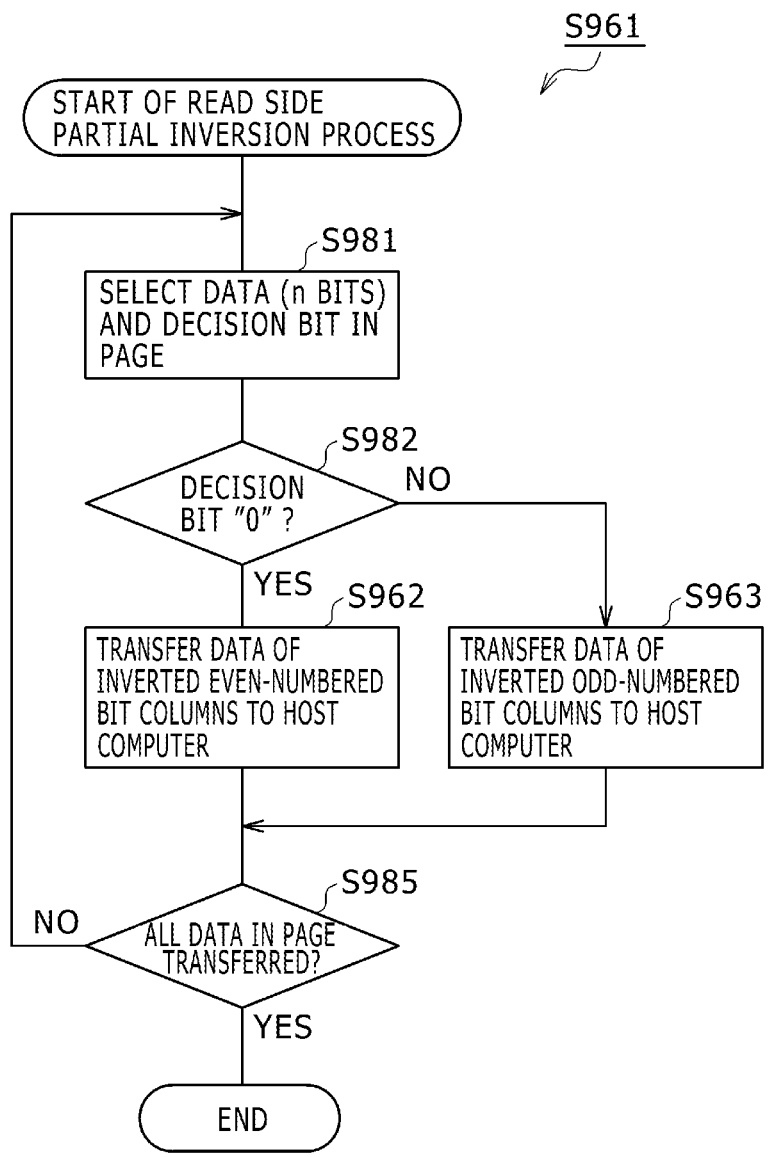
FIG. 37 is a flow chart illustrating an example of a read side partial inversion process illustrated in FIG. 36.

FIG. 37 is a flow chart illustrating an example of the read side partial inversion process at step S961 of FIG. 36. The read side partial inversion process is similar to the read side inversion process in the first embodiment except that processes at steps S962 and S963 are executed in place of the processes at steps S983 and S984.

After the process at step S981, the read side partial inversion portion 134 decides whether or not the decision bit indicates "0" at step S982. If the decision bit indicates "0" at step S982 and the decision at step S982 is Yes, then the read side partial inversion portion 134 transmits the data in which the even-numbered bit columns are inverted as read data to the host computer 300 (step S962).

On the other hand, if the decision bit indicates "1" at step S982 and the decision at step S982 is No, then the read side partial inversion portion 134 transmits the data in which the odd-numbered bit columns are inverted as read data to the host computer 300 at step S963. After the process at step S962 or step S963, the read side partial inversion portion 134 executes the process at step S985.

It is to be noted that, to the memory controlling section 100 in the fifth embodiment, the configurations disclosed in the second to fourth embodiments may be applied. This similarly applies also to a modification to the fifth embodiment hereinafter described.

In this manner, with the fifth embodiment, since the memory controlling section 100 inverts bit columns which include a greater number of bits of a specific value from between the even-numbered bit columns and the odd-numbered bit columns in data of n bits, the number of changing bits in the setting process or the resetting process can be reduced to n/2 or less. Consequently, the maximum power consumption in the setting process and the resetting process reduces.

6. Modification

Example of the Configuration of the Memory Controlling Section

While, in the fifth embodiment, the memory controlling section 100 inverts part of bits of data after a decision bit is generated, the decision bit may otherwise be generated after part of bits are inverted. The memory controlling section 100 according to the modification to the fifth embodiment is similar to that of the fifth embodiment except that a decision bit is generated after part of bits are inverted.

Figure 38:
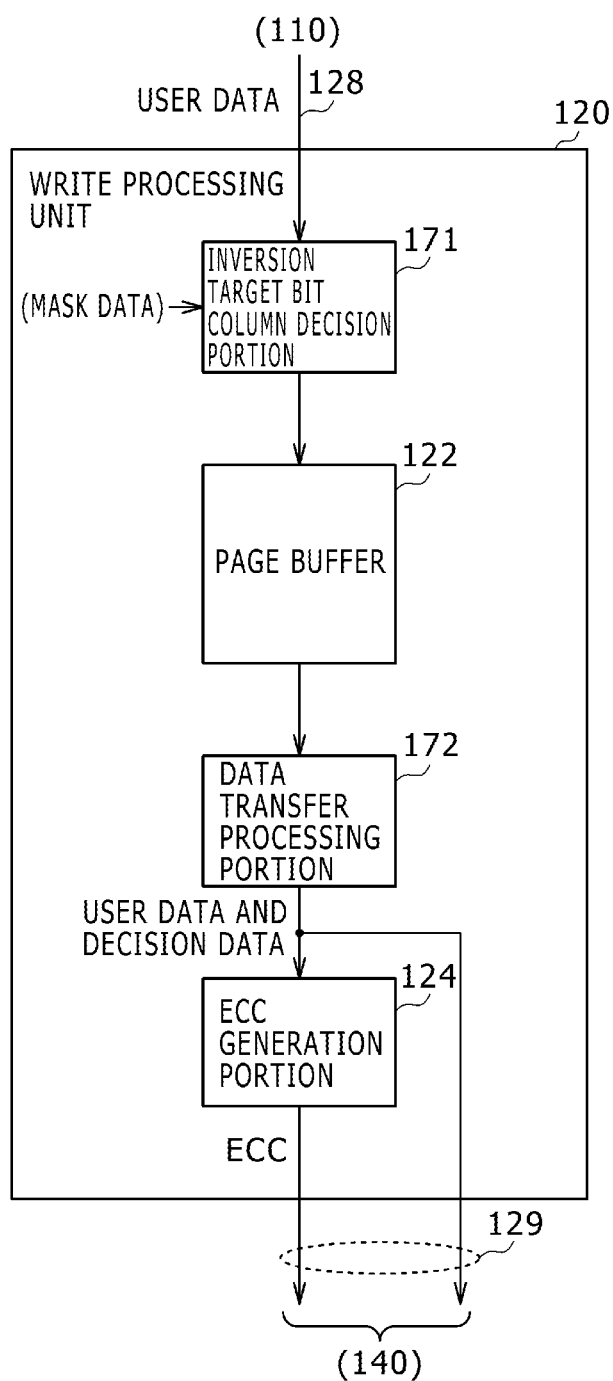
FIG. 38 is a block diagram showing an example of a configuration of the write processing unit in a modification to the fifth embodiment.

FIG. 38 is a block diagram showing an example of a configuration of the write processing unit 120 in the modification to the fifth embodiment. The write processing unit 120 in the modification is similar to that of the fifth embodiment except that an inversion target bit column decision portion 171 and a data transfer processing portion 172 are provided in place of the inversion target bit column decision portion 161 and the write side partial inversion portion 165.

The inversion target bit column decision portion 171 generates data $N_A'$ in which the even-numbered bit columns are inverted in data N and data $N_B'$ in which the odd-numbered bit columns are inverted. The inversion target bit column decision portion 171 counts the number of "0s" of the data $N_A'$ and data $N_B'$. The inversion target bit column decision portion 171 decides whether or not the count value of the data $N_B'$ is higher than the count value of the data $N_A'$ and retains a decision bit indicating a result of the decision and the data $N_A'$ or the data $N_B'$ into the page buffer 122. For example, if the count value of the data $N_B'$ is higher than that of the data $N_A'$, then the inversion target bit column decision portion 171 generates a decision bit of "1" and retains the generated decision bit into the page buffer 122 together with the data $N_B'$. On the other hand, if the count value of the data $N_B'$ is equal to or lower than that of the data $N_A'$, then the inversion target bit column decision portion 171 generates a decision bit of "0" and retains the generated decision bit into the page buffer 122 together with the data $N_A'$.

The data transfer processing portion 172 transfers the decision bit and the data $N_A'$ or the data $N_B'$ to the ECC generation portion 124 and the memory interface 140.

Example of Operation of the Memory Controlling Section

Figure 39:
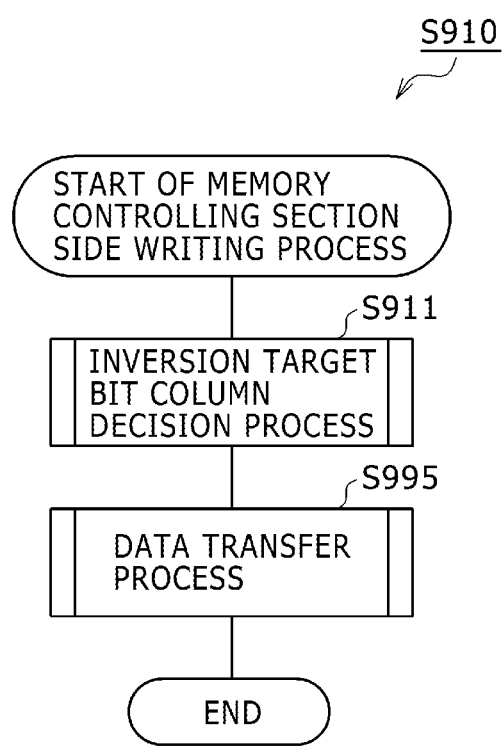
FIG. 39 is a flow chart illustrating an example of a memory controlling section side writing process in the modification to the fifth embodiment.

FIG. 39 is a flow chart illustrating an example of a memory controlling section side writing process in the modification to the fifth embodiment. The memory controlling section side writing process in the modification is similar to that of the fifth embodiment except that a process at step S995 is executed in place of the process at step S915. After the process at step S911 is executed, the memory controlling section 100 executes a data transfer process for transferring a decision bit and data which is partially inverted at step S995. After the process at step S995, the memory controlling section 100 ends the memory controlling section side writing process.

Figure 40:
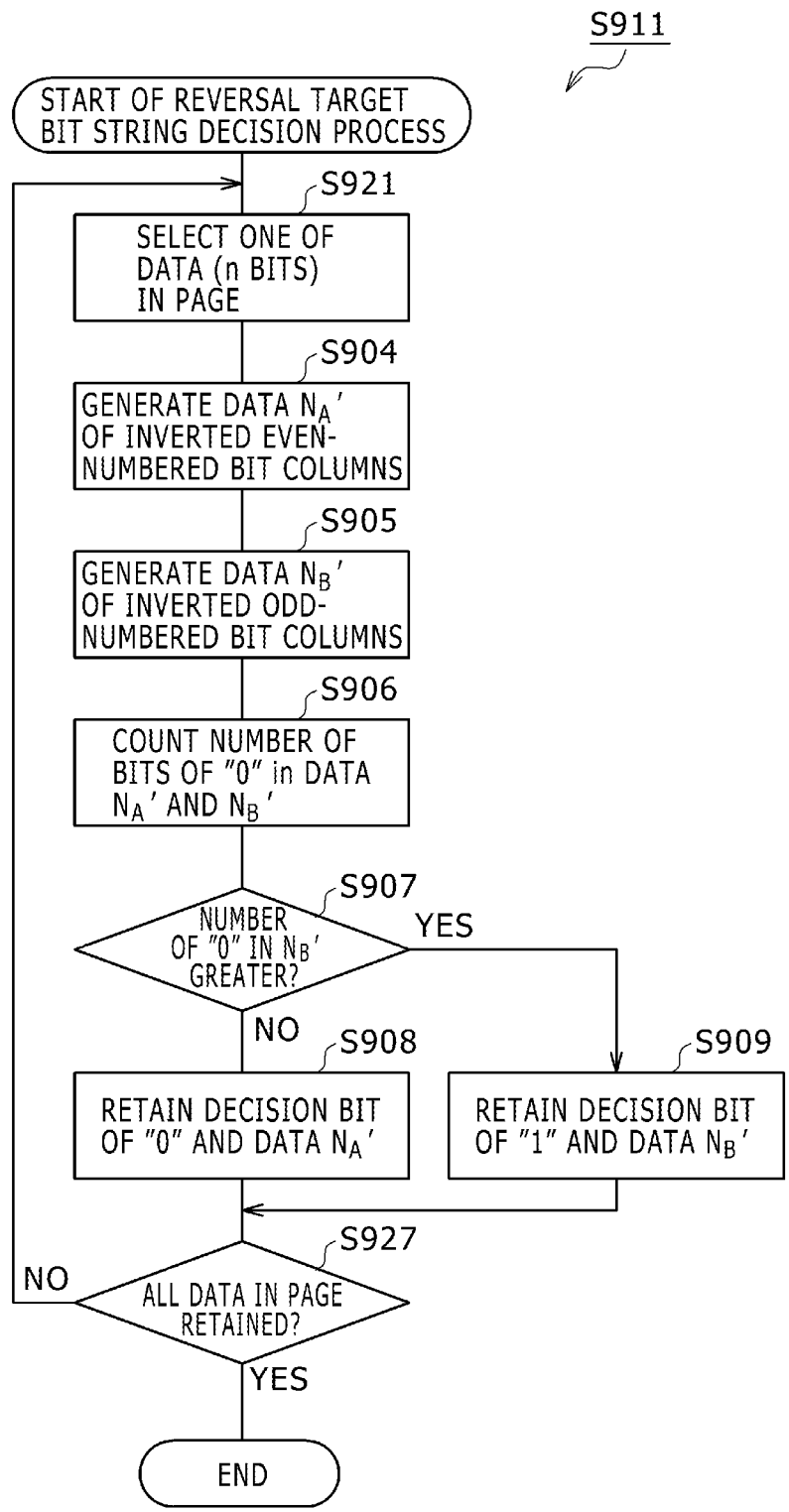
FIG. 40 is a flow chart illustrating an example of an inversion target bit column decision process illustrated in FIG. 39.

FIG. 40 is a flow chart illustrating an example of the inversion target bit column decision process at step S911 of FIG. 39 in the modification to the fifth embodiment. The inversion target bit column decision process in the modification is similar to the major bit decision process in the first embodiment except that processes at steps S904 to S909 are executed in place of the processes at steps S922 to S926.

After the process at step S921, the inversion target bit column decision portion 171 generates data $N_A'$ in which the even-numbered bit columns of the data N are inverted at step S904. Further, the inversion target bit column decision portion 171 generates data $N_B'$ in which the odd-numbered bit columns of the data N are inverted at step S905. The inversion target bit column decision portion 171 counts the number of bits of "0" of each of the data $N_A'$ and the data $N_B'$ at step S906. Then, the inversion target bit column decision portion 171 decides whether or not the number of "0s" included in the data $N_B'$ is greater at step S907.

If the count value in the data $N_B'$ is equal to or lower than that in the data $N_A'$ at step S907 and the decision at step S907 is No, then the inversion target bit column decision portion 171 generates a decision bit of "0" and retains the generated decision bit into the page buffer 122 together with the data $N_A'$ at step S908. On the other hand, if the number of "0s" in the data $N_B'$ is greater than that in the data $N_A'$ at step S907 and the decision at step S907 is Yes, then the inversion target bit column decision portion 171 generates a decision bit of "1" and retains the generated decision bit into the page buffer 122 together with the data $N_B'$ at step S909. After the process at step S908 or step S909, the inversion target bit column decision portion 171 executes the process at step S927.

Figure 41:
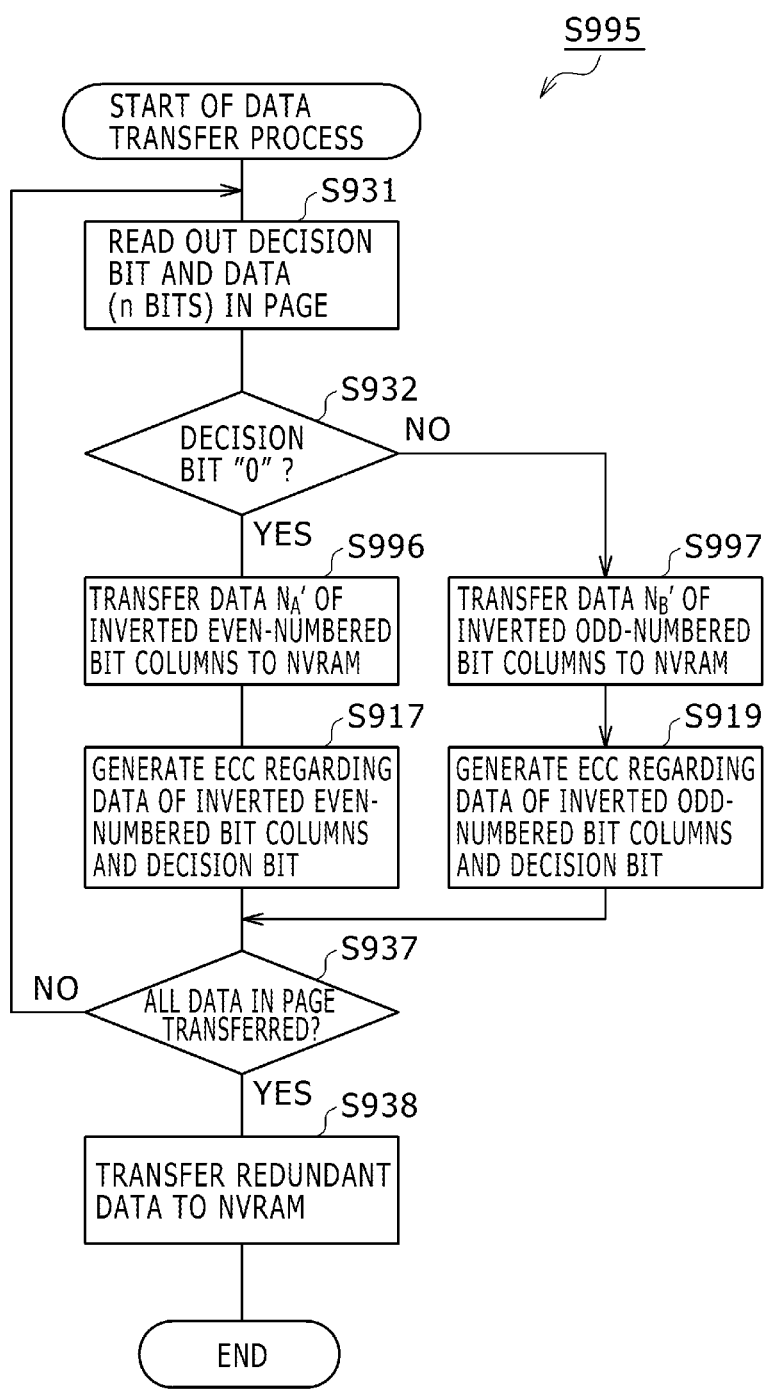
FIG. 41 is a flow chart illustrating an example of a data transfer process illustrated in FIG. 39.

FIG. 41 is a flow chart illustrating an example of the data transfer process at step S995 of FIG. 39 in the modification to the fifth embodiment. The data transfer process in the modification is similar to the write side partial inversion process of the fifth embodiment except that processes at steps S996 and S997 are executed in place of the processes at steps S916 and S918.

After the process at step S931, the data transfer processing portion 172 decides whether or not the decision bit is "0" at step S932. If the decision bit is "0" at step S932 and the decision at step S932 is Yes, then the data transfer processing portion 172 transfers the data $N_A'$ whose even-numbered bit columns are inverted as write data to the NVRAM 200 at step S996. Then, the data transfer processing portion 172 executes the process at step S917.

On the other hand, if the decision bit is "1" at step S932 and the decision at step S932 is No, then the data transfer processing portion 172 transfers the data $N_B'$ whose odd-numbered bit columns are inverted as write data to the NVRAM 200 at step S997. Then, the data transfer processing portion 172 executes the process at step S919.

In this manner, with the modification described above, the memory controlling section 100 can suppress the changing bit number in the setting process or the resetting process to one half or less of the total bit number by generating a decision bit based on a result of inversion of part of bits of data.

It is to be noted that the embodiments described hereinabove indicate examples for carrying out the present technology, and items in the embodiments and features described in the claims individually have a corresponding relationship. Similarly, the features in the claims and items in the embodiments of the present technology which are denoted by like reference names individually have a corresponding relationship. However, the present technology is not restricted to the embodiments but can be carried out by applying various modifications or alterations to the embodiments without departing from the subject matter of the present technology.

Further, the processing procedures described in the description of the embodiments may be grasped as a method having the procedures or may be grasped as a program for causing a computer to execute the procedures or a recording medium in which the program is stored. As the recording medium, for example, a CD (Compact Disc), an MD (Mini Disc), a DVD (Digital Versatile Disk), a memory card, a blue ray disk (Blu-ray Disc: registered trademark) and so forth are applicable.

It is to be noted that the present technology can assume such configurations as described below.

(1) A storage controlling apparatus, including:
a decision portion configured to decide whether or not a bit number of a specific value from between binary values is greater than a reference value in at least part of input data to a memory cell, which executes rewriting to one of the binary values and rewriting to the other one of the binary values in order in a writing process, to generate decision data indicative of a result of the decision; and
a write side outputting portion configured to output, when it is decided that the bit number is greater than the reference value, the input data at least part of which is inverted as write data to the memory cell together with the decision data.

(2) The storage controlling apparatus according to (1) above,
wherein the reference value is one half of the number of all bits of the input data;
the decision portion decides whether or not the number of bits of the specific value from among all bits is greater than the reference value; and
the write side outputting portion inverts and outputs, when it is decided that the bit number is greater than the reference value, the input data as the write data, but outputs, when it is decided that the bit number is not greater than the reference value, the input data as the write data without inverting the input data.

(3) The storage controlling apparatus according to (1) above,
wherein the input data is configured from two portions;
the decision portion decides whether or not the bit number is greater than the reference value at one of the two portions;
the reference value is the bit number of the specific value at the other one of the two portions; and
the write side outputting portion outputs, when it is decided that the bit number is greater than the reference value, the input data the one portion of which is inverted as the write data, but outputs, when it is decided that the bit number is not greater than the reference value, the input data the other one portion of which is inverted as the write data.

(4) The storage controlling apparatus according to any one of (1) to (3) above, further including:
a data acquisition unit configured to acquire data and the decision data corresponding to the data from the memory cell; and
a read side outputting portion configured to invert, when the decision data indicates that the bit number is greater than the reference value, at least part of the acquired data and output the resulting data as read data.

(5) The storage controlling apparatus according to (4) above, further including
a buffer configured to retain the read data and the decision data corresponding to the read data,
wherein the write side outputting portion reads out the read data and the decision data from the buffer and outputs, when the decision data indicates that the bit number is greater than the reference value, the read data at least part of which is inverted as the write data.

(6) The storage controlling apparatus according to (4) or (5) above, further including
a buffer configured to retain the read data,
wherein a major bit decision portion reads out the read data from the buffer and further decides whether or not the bit number of the specific value is greater than the reference value in at least part of the read data to generate the decision data; and
a write side inversion portion further outputs, when the decision data indicates that the bit number is greater than the reference value, the read data at least part of which is inverted as the write data.

(7) The storage controlling apparatus according to any one of (1) to (6) above, further including
a data size changing unit configured to change the number of all bits of the input data based on a data size received in notification from the memory cell,
wherein the major bit decision portion changes the reference value in response to the number of all changed bits.

(8) The storage controlling apparatus according to any one of (1) to (7) above, wherein the major bit decision portion counts the number of bits of the specific value in the target data and compares the count value and the reference value with each other to decide whether or not the bit number of the specific value is greater than the reference value.

(9) A memory system, including:
a memory cell configured to execute rewriting into one of binary values and rewriting into the other one of the binary values in order in a writing process;
a decision portion configured to decide whether or not a bit number of a specific value from between the binary values is greater than a reference value in at least part of input data to the memory cell to generate decision data indicative of a result of the decision; and a write side outputting portion configured to output, when it is decided that the bit number is greater than the reference value, the input data at least part of which is inverted as write data to the memory cell together with the decision data.

(10) An information processing system, including:

a host computer configured to issue a write command for an instruction of a writing process of input data;

a memory cell configured to execute rewriting into one of binary values and rewriting into the other one of the binary values in order in the writing process;

a decision portion configured to decide whether or not a bit number of a specific value from between the binary values is greater than a reference value in at least part of the input data to generate decision data indicative of a result of the decision; and a write side outputting portion configured to output, when it is decided that the bit number is greater than the reference value, the input data at least part of which is inverted as write data to the memory cell together with the decision data.

(11) A storage controlling method, including:

deciding, by a decision portion, whether or not a bit number of a specific value from between binary values is greater than a reference value in at least part of input data to a memory cell, which executes rewriting into one of the binary values and rewriting into the other one of the binary values in order in a writing process, to generate decision data indicative of a result of the decision; and outputting, by a write side outputting portion, when it is decided that the bit number is greater than the reference value, the input data at least part of which is inverted as write data to the memory cell together with the decision data.

The present technology contains subject matter related to that disclosed in Japanese Priority Patent Applications JP 2012-092591 and JP 2012-237590 filed in the Japan Patent Office on Apr. 16, 2012 and Oct. 29, 2012, respectively, the entire content of which is hereby incorporated by reference.

What is claimed is:

1. A storage controlling apparatus, comprising:
    a decision portion configured to decide whether or not a number of bits of a specific value from between binary values is greater than a reference value at one of two portions of input data to a memory cell, which executes rewriting to one of the binary values and rewriting to the other one of the binary values in order in a writing process, to generate decision data indicative of a result of the decision, wherein the reference value is the number of bits of the specific value at the other one of the two portions; and
    a write side outputting portion configured to output, when it is decided that the number of bits is greater than the reference value, the input data, wherein the one portion, but not all, of which is inverted as write data to the memory cell together with the decision data,
    wherein the decision portion is further configured to decide whether a first count of the number of bits of the specific value in odd-numbered bit columns of the input data is greater than a second count of the number of bits of the specific value in even-numbered bit columns of the input data and to generate the decision data indicative of the result of the decision.

2. The storage controlling apparatus according to claim 1, wherein the reference value is one half of a total number of bits of the input data;

the decision portion decides whether or not the number of bits of the specific value from among the total number of bits is greater than the reference value; and the write side outputting portion inverts and outputs, when it is decided that the number of bits is greater than the reference value, the input data as the write data, but outputs, when it is decided that the number of bits is not greater than the reference value, the input data as the write data without inverting the input data.

3. The storage controlling apparatus according to claim 1, wherein the write side outputting portion outputs, when it is decided that the number of bits is greater than the reference value, the input data the one portion of which is inverted as the write data, but outputs, when it is decided that the number of bits is not greater than the reference value, the input data the other one portion of which is inverted as the write data.

4. The storage controlling apparatus according to claim 1, further comprising:
    a data acquisition unit configured to acquire data and the decision data corresponding to the data from the memory cell; and
    a read side outputting portion configured to invert, when the decision data indicates that the number of bits is greater than the reference value, at least part of the acquired data and output the resulting data as read data.

5. The storage controlling apparatus according to claim 4, further comprising a buffer configured to retain the read data and the decision data corresponding to the read data,
    wherein the write side outputting portion reads out the read data and the decision data from the buffer and outputs, when the decision data indicates that the number of bits is greater than the reference value, the read data at least part of which is inverted as the write data.

6. The storage controlling apparatus according to claim 4, further comprising:
    a buffer configured to retain the read data, wherein a major bit decision portion reads out the read data from the buffer and further decides whether or not the number of bits of the specific value is greater than the reference value in at least part of the read data to generate the decision data; and
    a write side inversion portion further outputs, when the decision data indicates that the number of bits is greater than the reference value, the read data at least part of which is inverted as the write data.

7. The storage controlling apparatus according to claim 1, further comprising a data size changing unit configured to change a total number of bits of the input data based on a data size received in notification from the memory cell, wherein the decision portion changes the reference value in response to a number of changed bits.

8. The storage controlling apparatus according to claim 1, wherein the decision portion counts the number of bits of the specific value in target data and compares a count value and the reference value with each other to decide whether or not the number of bits of the specific value is greater than the reference value.

9. The storage controlling apparatus according to claim 1, wherein a number of bits rewritten in the memory cell based on the inversion is either equal to or less than the reference value.

10. The storage controlling apparatus according to claim 1, further comprising a write side partial inversion portion configured to invert the odd-numbered bit columns or the even-numbered bit columns based on a comparison of the first count and the second count of the number of bits as the decision data.

11. A memory system, comprising:
a memory cell configured to execute rewriting into one of binary values and rewriting into the other one of the binary values in order in a writing process;
a decision portion configured to decide whether or not a number of bits of a specific value from between the binary values is greater than a reference value at one of two portions of input data to the memory cell to generate decision data indicative of a result of the decision, wherein the reference value is the number of bits of the specific value at the other one of the two portions; and
a write side outputting portion configured to output, when it is decided that the number of bits is greater than the reference value, the input data, wherein the one portion, but not all, of which is inverted as write data to the memory cell together with the decision data,
wherein the decision portion is further configured to decide whether a first count of the number of bits of the specific value in odd-numbered bit columns of the input data is greater than a second count of the number of bits of the specific value in even-numbered bit columns of the input data and to generate the decision data indicative of the result of the decision.

12. The memory according to claim 11, further comprising a write side partial inversion portion configured to invert the odd-numbered bit columns or the even-numbered bit columns based on a comparison of the first count and the second count of the number of bits as the decision data.

13. An information processing system, comprising:
a host computer configured to issue a write command for an instruction of a writing process of input data;
a memory cell configured to execute rewriting into one of binary values and rewriting into the other one of the binary values in order in the writing process;
a decision portion configured to decide whether or not a number of bits of a specific value from between the binary values is greater than a reference value at one of two portions of the input data to generate decision data indicative of a result of the decision, wherein the reference value is the number of bits of the specific value at the other one of the two portions; and
a write side outputting portion configured to output, when it is decided that the number of bits is greater than the reference value, the input data, wherein the one portion, but not all, of which is inverted as write data to the memory cell together with the decision data,
wherein the decision portion is further configured to decide whether a first count of the number of bits of the specific value in odd-numbered bit columns of the input data is greater than a second count of the number of bits of the specific value in even-numbered bit columns of the input data and to generate the decision data indicative of the result of the decision.

14. The information processing system according to claim 13, further comprising a write side partial inversion portion configured to invert the odd-numbered bit columns or the even-numbered bit columns based on a comparison of the first count and the second count of the number of bits as the decision data.

15. A storage controlling method, comprising:
deciding, by a decision portion, whether or not a number of bits of a specific value from between binary values is greater than a reference value at one of two portions of input data to a memory cell, which executes rewriting into one of the binary values and rewriting into the other one of the binary values in order in a writing process, to generate decision data indicative of a result of the decision, wherein the reference value is the number of bits of the specific value at the other one of the two portions;
outputting, by a write side outputting portion, when it is decided that the number of bits is greater than the reference value, the input data, wherein the one portion, but not all, of which is inverted as write data to the memory cell together with the decision data; and
deciding, by the decision portion, whether a first count of the number of bits of the specific value in odd-numbered bit columns of the input data is greater than a second count of the number of bits of the specific value in even-numbered bit columns of the input data, and to generate the decision data indicative of the result of the decision.

* * * * *